(12) United States Patent
Reddy

(10) Patent No.: US 6,509,217 B1
(45) Date of Patent: Jan. 21, 2003

(54) INEXPENSIVE, RELIABLE, PLANAR RFID TAG STRUCTURE AND METHOD FOR MAKING SAME

(76) Inventor: Damoder Reddy, 16457 W. Mozart Ave., Los Gatos, CA (US) 95032

( * ) Notice: Subject to any disclaimer, the term of this patent is extended or adjusted under 35 U.S.C. 154(b) by 0 days.

(21) Appl. No.: 09/425,494

(22) Filed: Oct. 22, 1999

(51) Int. Cl.[7] .............................................. H01L 21/00
(52) U.S. Cl. ...................... 438/153; 438/155; 438/210; 438/238; 438/280
(58) Field of Search ................................ 438/149, 153, 438/155, 210, 238, 280; 29/600

(56) References Cited

U.S. PATENT DOCUMENTS

| | | | |
|---|---|---|---|
| 4,786,907 A | 11/1988 | Koelle | 342/51 |
| 4,816,839 A | 3/1989 | Landt | 343/795 |
| 4,877,641 A | 10/1989 | Dory | 427/38 |
| 4,910,499 A | 3/1990 | Benge et al. | 340/572 |
| 5,346,850 A | 9/1994 | Kaschmitter et al. | 437/81 |
| 5,444,223 A | 8/1995 | Blama | 235/435 |
| 5,528,222 A | 6/1996 | Moskowitz et al. | 340/572 |
| 5,572,226 A | 11/1996 | Tuttle | 343/726 |
| 5,708,419 A | 1/1998 | Isaacson et al. | 340/572 |
| 5,779,839 A | 7/1998 | Tuttle et al. | 156/213 |
| 5,786,626 A | 7/1998 | Brady et al. | 257/673 |
| 5,796,121 A | 8/1998 | Gates | 257/59 |
| 5,817,550 A | 10/1998 | Carey et al. | 438/166 |
| 5,856,858 A | 1/1999 | Carey et al. | 349/158 |
| 5,912,632 A | 6/1999 | Dieska et al. | 340/825.54 |
| 5,929,760 A | 7/1999 | Monahan | 340/572.7 |
| 6,024,285 A * | 2/2000 | Mish | 156/300 |
| 6,027,027 A * | 2/2000 | Smithgall | 235/487 |
| 6,031,597 A * | 2/2000 | Knirck et al. | 355/53 |
| 6,100,804 A * | 8/2000 | Brady et al. | 257/678 |
| 6,275,681 B1 * | 8/2001 | Vega et al. | 455/343 |
| 6,278,413 B1 * | 8/2001 | Hugh et al. | 340/572.1 |
| 6,320,509 B1 * | 11/2001 | Brady et al. | 340/572.7 |
| 6,349,671 B1 * | 2/2002 | Lewis et al. | 119/51.02 |

OTHER PUBLICATIONS

"1994 Display Manufacturing Technology Conference Digest of Technical Papers", Society for Information Display, First Edition, Jan., 1994, 16 pages.

"1994 Seminar Lecture Notes", Society for Information Display, vol. I: Jun. 13, 1994, Figures 1–44, 23 pages.

"1995 Display Manufacturing Technology Conference Digest of Technical Papers", Society for Information Display, First Edition, Jan., 1995, 16 pages.

(List continued on next page.)

*Primary Examiner*—Long Pham
*Assistant Examiner*—Thanh V Pham
(74) *Attorney, Agent, or Firm*—Ronald Craig Fish; Ronald Craig Fish, A Law Corporation

(57) ABSTRACT

Process and device structures for constructing RFID tag and smart card and toy controller integrated circuit transceivers built inexpensively using flat panel display manufacturing machines on large plastic or glass or plastic laminated to glass substrates using thin film technologies at low temperatures and using chemicals and gases which will not attack or damage the substrate. Also disclosed are structures to eliminate the reliability problems caused by differential strain caused by different coefficients of thermal expansion.

18 Claims, 10 Drawing Sheets

UPSIDE DOWN TRANSISTOR ON TOP OF PRINTED ANTENNA

OTHER PUBLICATIONS

"An Amorphous Silicon Thin Film Transistor Fabricated at 125° C by DC Reactive Magnetron Sputtering", C.S. McCormick, et al., Appl. Phys. Lett. 70 (2), Jan. 13, 1997, 1997 American Institute of Physics.

"Low Temperature Fabrication of Amorphous Silicon Thin Film Transitors by DC Reactive Magnetron Sputtering", C.S. McCormick, et al., J. Vac. Sci. Technol. A 15(5), Sep./Oct. 1997, 1997 American Vacuum Society.

"Chapter 3, Manufacturing and Infrastructure of Active Matrix Liquid Crystal Displays", Malcolm Thompson, Dec. 10, 1997.

"PolySilicon Thin Film Transistors Fabricated at 100° C on a Flexible Plastic Substrate", Yij. Tung, et al.,.

"RFID: Card Manufacturing Fundaments", Michael L. Davis, Oct. 11, 1999, 53 pages of slides.

"Computer Display Industry and Technology Profile", Display Industry and Technology Profile, Jul. 28, 1999, 59 pages.

* cited by examiner

UPSIDE DOWN TRANSISTOR ON TOP OF PRINTED ANTENNA

SCHEMATIC OF A SINGLE EEPROM BUILT ON PET WITH THE CONTACT PADS AND THE ANTENNA PRINTED ON TOP OF THE TRANSISTOR; GATE WILL BE CONNECTED TO THE TRANSISTORS (IN ACTUAL DEVICES MULTIPLE TRANSISTORS AND EEPROM WILL BE CONNECTED TO THE CONTACT PADS)

SCHEMATIC OF A SINGLE EEPROM BUILT ON TOP OF THE PRINTED ANTENNA
(IN ACTUAL DEVICES EEPROM AND MULTIPLE TRANSISTORS WILL BE CONNECTED TO THE CONTACT PADS)

INEXPENSIVE, RELIABLE, PLANAR RFID TAG STRUCTURE AND METHOD FOR MAKING SAME

FIELD OF USE

The invention pertains to the field of RFID tag structures and methods for constructing RFID tags.

RFID tags are passive transceivers which are small, integrated and have RF or electromagnetic receive and transmit capabilities but no batteries (some tags have batteries and these are referred to as active tags with the no battery class referred to as passive tags). Power for the internal operations of a passive tag in receiving RF inquiry transmissions, storing data, reading data and RF reply transmissions is generated by rectifying a received RF inquiry transmission. Such RFID tags have many internal memory cells that can be read only (ROM), write-once-read-many (WORM), or fully rewritable memory such as EEPROM. As such they can store much more data than can be recorded on a bar code tag, and they can have the data recorded thereon changed. Such properties are useful in such environments as tracking of packages for UPS or Federal Express type couriers services, inventory of the contents of pallets (multiple RFID tags can be read simultaneously), tracking baggage in airline operations determining whose bags are on a cart or in a baggage compartment etc. The RFID technology disclosed herein is good for these applications as well as for use in smart cards.

The possible uses of RFID tags are numerous and varied, but one barrier to their use is their expense. Typical RFID tags require an antenna to be formed on a plastic substrate, an RF transceiver and memory circuit to be built in integrated circuit form and then the IC is bonded to the plastic substrate and connections between the IC and the antenna connection pads are wire bonded. Some antennas in the 125 kHz operating frequency band require about 200 turns, whereas antennas for the 13.56 Mhz band require only 4 turns. Antennas can be wire wound, etched photolithographically or silk screened on the substrate. Longer antennas created by the wire winding process give greater operating range, but the wound coil antenna process is typically also the most expensive prior art antenna process.

The most expensive part of the overall RFID process is making the IC itself with costs ranging from between ten and fifty cents. The cost of the wire bonding process is the next most expensive part of the overall process followed by the cost to fabricate the antenna.

In order for RFID tags to become commercially successful with volume in the billions of units per year, the cost of the total tag must be brought down to 5 cents or lower per tag. To reduce costs to this level, the current process for fabrication and the resulting construction cannot be used.

The current form of RFID tag construction is too expensive, and it has reliability problems in high temperature applications. The reliability problems in high temperature applications arise out of the differences in thermal coefficient of expansion between the bulk silicon of the IC substrate and the plastic substrate on which the antenna is formed. The difference in coefficients of expansion lead to stresses in the structure which can fracture the chip or break the wire bond between the transceiver and the antenna. The current separately formed chips are also too expensive. Finally, the structure of prior art RFID tags which have an integrated circuit bonded thereto is not monolithic. This results from the fact that the IC containing the transceiver is about 0.5 mm thick whereas the plastic substrate on which the antenna is formed is much, much thinner. This can be a problem in some applications where, for example, the RFID tag is to be run through a printer to have bar code printed on top of the RFID tag to act as a backup source of information about an article to which the tag is attached.

Therefore, a need has arisen for a structure for an RFID tag which can be made more inexpensively, which is subject to fewer reliability problems by virtue of elimination of the differences in coefficients of thermal expansion, and which has a more planar profile than the prior art RFID tag structures.

SUMMARY OF THE INVENTION

The teachings of the first two classes of embodiments of the invention are equally applicable to both RFID tags and smart cards with RF transponder/processor/memory circuits integrated directly onto the same plastic substrate on which the antenna is formed. Typically the antenna will have two terminals for connection to the RF input/output terminals of the integrated circuit, but in some embodiments, there may be only one terminal for the antenna that is connected directly to the IC with the other terminal connected to a ground plane of conductive material formed on the plastic substrate with the IC having one RF I/O terminal coupled to the antenna and the other coupled to the ground plane. The phrase "integrated on" as used in the claims means an integrated circuit that is formed directly on the plastic substrate by processing the plastic substrate in flat panel display manufacturing or other semiconductor wafer processing machines used for making integrated circuits. The phrase "bonded or otherwised attached to" is intended to describe a plastic substrate upon which is bonded an integrated circuit made on another glass or plastic substrate elsewhere which is then diced and bonded or otherwise physically attached to the plastic substrate.

The ICs that are used to control toys and other equipment that requires cheaply constructed integrated circuits may also be made using the teachings of the invention.

Preferably, the ICs are fabricated on the plastic substrate using the semiconductor processing machines which are used to form thin film transistors at multiple locations on large plastic or glass substrates which are used in manufacture flat panel displays for televisions and computers. These machines operate under the control of data in process configuration or recipe files that define the process temperatures, gas types and composition, RF energy levels etc. that together are the selected one of the process recipes defined herein which are compatible with the substrate selected for the RFID tag or smart card so as not to melt, warp, deform, chemically attack or otherwise damage the substrate. It is easiest to tell the flat panel manufacturing machine manufacturer at the outset which gases are to be used. That way the machine is configured at the factory with the proper gas flow controller since each gas has its own density, and requires a unique flow controller to make sure the right amount of gas is added to the process. However, existing flat panel manufacturing machines can be retrofitted for new gases by changing the flow controller and removing all the old plumbing from the gas supply through the flow controllers to the deposition chambers so that residues of gases previously used in the machine are not inadvertantly added to the process.

In a separate class of embodiments, the ICs are fabricated by the thousands or millions on large plastic or glass substrates using the thin film transistor processing machines used in the flat panel display business, as modified to use process recipes compatible with the substrate selected. "Large" as that term is used herein means larger than the largest diameter semiconductor wafer capable of being processed with the current generation of semiconductor processing equipment.

The invention of the first two classes of embodiments achieves three advantages over the prior art simultaneously. First, by integrating a large number of separate RFID tag transceivers onto large plastic substrates which have a matching number of antennas integrated thereon and dicing the substrate up into individual RFID tags or smart card internal circuits, large cost savings are achieved. This is because the manufacture in bulk of the integrated circuit, which is the largest cost component, saves money on a per unit basis. With the IC formed directly on the same substrate as the antenna, the costs in the prior art process of dicing up the semiconductor wafers into individual transceiver ICs is saved as is the cost of die bonding, wire bonding and flip-chip bonding. Second, reliability is increased. This is because the IC is formed on the same substrate as the antenna and there is a special coating on the plastic substrate to prevent mismatches in the coefficients of thermal expansion that caused differential strain in the prior art. This differential strain occurred at high temperatures and led to failures of prior art tags used in high temperature applications such as inside ovens. As used in the claims, the phrase "little or no differential strain between the substrate and said layer occurs in the normal operating temperature range of said integrated circuit" means not enough difference in the strain between the strain in the substrate at a given temperature and the layer of oxide, nitride or other material coated over the substrate occurs to cause fractures or stress that cause immediate or eventual reliability problems or failure of the circuit.

Finally, the resulting structure with the IC integrated directly on the plastic substrate as the antenna is much more planar than the prior art die bonded structures. This eliminates certain problems experienced with prior art tags which needed to be flat such as where the tag needs to be run through a printer so that a bar code can be printed thereon.

The teachings of the invention in third and fourth classes of embodiments are also useful in RFID tags and smart cards, but are more useful in manufacturing of cheap ICs on plastic substrates for mass produced smart toys etc.

In a first class of embodiments, a polyester, PVC or polyimide or other plastic substrate has formed thereon a layer of silicon nitride or silicon dioxide. Hereafter, this layer will be referred to as the nitride layer, but this terminology is to be interpreted as meaning the layer is made of silicon nitride, silicon dioxide or any other material that can be formed in such a thickness and has appropriate properties to reduce or eliminate the thermal coefficient of expansion mismatch reliability problem that is found in high temperature applications. The nitride layer serves to reduce or eliminate the reliability problems cause by mismatches in the coefficient of thermal expansion between the nitride layer and the plastic substrate on which the transceiver is formed. The key to eliminating the reliability problems at high temperatures is to avoid substantial mismatches in the amount of strain that occurs at a given temperature between the plastic substrate on which the transceiver is fabricated and the nitride layer that insulates the substrate from the transceiver circuitry. The amount of strain that occurs in a material in thermal expansion is a function of its Young's Modulus, the temperature and its geometry, especially its thickness. The trick then is to establish the thickness of the nitride layer (or whatever other material is chosen) so as to establish a "strain" value which substantially matches within about 5–10% or, preferably, exactly the strain value of the underlying plastic substrate at the same temperature given the geometry and material of the substrate.

In the first embodiment, after forming the antenna, optionally a layer of silicon dioxide is formed over the silicon nitride layer to act as an insulator. It is possible to use the silicon nitride strain matching layer as the insulator without adding the additional layer of oxide. Then a layer of amorphous, polycrystalline or microcrystalline silicon is formed over the silicon dioxide insulator layer. This layer of semiconductor is then processed by low temperature thin film integrated circuit processing steps detailed in the patents to Lawrence Livermore Laboratory to form thin film transistors on the plastic substrate. These transistors are organized into an RF transceiver section, a processor section and memory cells to store data. The memory cells can be static RAM if a battery is bonded to or integrated onto the tag to make it an active tag or they may be EEPROM cells for nonvolatile storage.

After the transceiver is formed, a layer of silicon dioxide is formed over the top of the integrated circuit. The silicon dioxide layer is then masked and etched to form two via holes through the silicon dioxide layer to two RF input/output terminals of the circuitry of the RFID tag. Finally, a layer of copper is sputtered or otherwise deposited over the layer of silicon dioxide so as to cover the entire surface of the substrate and so as to enter the via holes and make electrical contact with the RF terminals of the transceiver. This layer of metal is then patterned and etched photolithographically to form several windings that wind around the circumference of the plastic substrate to form what is essentially a coiled dipole antenna.

The cost of making the integrated circuit is held down by using the known flat panel display manufacturing machinery to make huge numbers of ICs in each batch. These machines are used to make the thin film transistor structures in amorphous silicon deposited on the glass or plastic substrate of large flat panel displays used in laptop computers and other appliances. This allows huge numbers of RFID tags to be simultaneously manufactured thereby reducing the cost per chip. In some embodiments, the large plastic substrates can be processed in localized areas where the IC transistors are to be formed in amorphous semiconductor which has been locally deposited using shadow masks. In other embodiments, the layers of semiconductor, silicon dioxide, metal etc which need to be deposited to form the IC circuit can be deposited over the entire plastic substrate and then etched back to form individual ICs connected to antennas integrated on the same e substrate. These flat panel manufacturing machines are modified to use the process recipes defined in the patents to University of California, Livermore Labs, IBM and other companies for making thin film transistors on plastic substrates so that no process step is carried out at a temperature which is higher than the melting point of the substrate ("melting" as the term is used herein and in the claims means reaching the glass transition temperature or reaching a temperature where there is significant shrinkage or deformation of the plastic substrate). The flat panel machines are capable of making thin films of silicon dioxide, silicon nitride, amorphous silicon, and laying down and etching metalization patterns. They are also capable of doing excimer laser annealing of doping layers deposited by PECVD on top of amorphous silicon and pulsed excimer laser crystallization of amorphous silicon to form polysilicon.

A second class of embodiments has the transceiver integrated directly on the substrate with the antenna and with the IC integrated over the antenna. This class of embodiments will be referred to as the "upside down" embodiments and is actually the preferred form. In this class of embodiments, after forming the nitride layer on both surfaces of the plastic substrate, a layer of metal is deposited on top of the nitride layer and etched to form two leads from two antenna connection pad locations to RF output locations of wherever the TFID transceiver is to be formed. Next, if the antenna metal is to be some metal such as copper which has a different electrical potential than the metal such as aluminum used for the leader lines, a silver or conductive epoxy contact pad is deposited and etched at the contact pad junction where the two dissimilar metals will be put into electrical contact with each other. This prevents electolytic current based corrosion from destroying the contact junction.

Next, the antenna is formed on top of the silicon nitride or silicon dioxide layer and on top of the contact pads at the end of the leader lines. In some embodiments, the antenna can be formed below the layer of metal upon which the leader lines are formed and above the nitride layer.

Formation of the antenna can be done by any one of the three prior art methods but usually by either the photolithography or silk screening processes. In the silk screening process, the metal of the antenna terminal portions is simply printed over the contact pads. If photolithography is used, a layer of insulation such as silicon dioxide may need to be formed over the leader lines with vias etched through to the contact pads. The preferred method for forming the antenna is by sputter deposition or electroplating of copper and photolithographic etching to form an antenna that wraps around the top surface of the plastic substrate to make a series of planar loops with terminals at the contact pads at the end of the leader line. If the antenna is formed below the layer upon which the leader lines are formed a layer of insulation is formed over the antenna and via holes are etched down through it to the antenna terminals.

After forming the antenna, a layer of silicon dioxide is deposited and etched back to form an insulating layer over the leader lines with via holes down to the leader lines where the RF outputs of the RFID transceiver are to be formed. For purposes of illustration of the upside down process, assume these via holes will form connections between the source and drain regions of an upside down thin film transistor and the leader lines.

Next, a layer of metal is deposited over the silicon dioxide layer and etched back to remove all the metal except that filling the via holes. Then a layer of amorphous silicon or microcrystalline silicon is deposited so as to form a layer of semiconductor material covering the regions where the vias are located. In embodiments where greater speed of operation of the transistor are required, this silicon can be crystallized to polysilicon by the pulsed laser process described in a paper and several patents by scientists at Lawrence Livermore National Laboratory.

Next, a layer of silicon dioxide is deposited by low temperature chemical vapor deposition to form the gate oxide. Then a layer of aluminum or other metal is deposited over the gate oxide layer. These two layers are then etched back to define the gate and gate oxide island of the thin film transistor. This exposes the underlying semiconductor layer at locations outside the island. The source and drain regions of the transistor are then formed by doping the semiconductor layer using low temperature chemical vapor deposition.

The resulting structure is then photolithographically etched back to define a localized integrated circuit thereby defining the boundaries of each transistor formed in the semiconductor layer. Finally, a layer of silicon dioxided is deposited over the entire substrate, and via holes are etched therein to make contact with the gates drains and sources of the various transistors where necessary to form the actual RFID transceiver circuit to be used. A layer of metal is then deposited and photolithographically etched to fill the via holes and make the necessary interconnections between the transistors to form the processor, memory array and RF transceiver circuits of the RFID tag.

Another class of embodiments is defined by the following characteristics. First, inexpensive RFID tag ICs comprised of thin film transistors on plastic substrates are fabricated in bulk using the huge volume flat panel display fabrication machines which are in public use here and in the far east to make flat panel displays for televisions and computers. These machines are modified in the manner described above in the summary to use the low temperature processes defined in the various patents and papers authored by scientists at Lawrence Livermore National Labs, IBM and others to make thin film transistors on plastic substrates.

After formation of thousands or hundreds of thousands of individual RFID tag transceiver ICs on one big plastic substrate, the substrate is cut up into individual ICs. These are bonded to another plastic substrate upon which the antenna is formed using conventional methods.

Next, the RF output terminals of the RFID tag transceiver are wire bonded to the antenna connection pads and the structure is complete. Although this class of embodiments is not as flat as the first two classes of embodiments and does not eliminate the expense of the wire bonding process, it does solve the major problems of cost and reliability in high temperature embodiments. As such, the processes and structure of the IC on a plastic substrate are useful in many other applications where cheap ICs are needed (such as toys) in addition to smart cards and RFID tags. The particular IC circuitry manufactured can be changed by changing the masks, so the advantage is to be able to make these ICs on plastic substrates by the hundreds of thousands using the flat panel display manufacturing machines and the processes developed by Lawrence Livermore Labs, IBM and others for making thin film transistors on plastic substrates. Because the ICs are manufactured in huge lots on plastic substrates, the cost of each IC goes down drastically. Further, because the RFID tag IC is built on a plastic substrate which can be the same material as the plastic substrate upon which the antenna is formed, there is no mismatch in the coefficients of thermal expansion which lead to reliability problems in high temperature environments.

Another alternative class of embodiments similar to the class just described uses low cost RFID tag transceivers fabricated as thin film transistors on glass substrates. These low cost RFID tag transceivers are fabricated as thin film transistor technology using the same processing steps and the same machines as are used in the flat panel manufacturing processes without the need for changes to the machine configuration or the processing temperatures used. Because they can be manufactured by the hundreds of thousands on large glass substrates as opposed to by the thousands on 6 or 8 inch semiconductor wafers, the cost per unit drops dramatically. These glass substrates are then cut up into individual ICs and bonded onto plastic substrates upon which antennas have been previously fabricated. The RF outputs are then wire bonded to the antenna terminals. This class of embodiments does not eliminate the cost of the wire bonding and is not monolithically flat, but the cost of the completed tag is much lower than the prior art tags because of the lower IC fabrication costs. Substrate sizes in flat panel processing with either glass or plastic are currently up to one meter by one meter. This size substrate can yield up to one million RFID tag transceiver ICs, and this will drastically reduce the cost of the ICs. Since the IC cost are the majority of the overall cost of the RFID tag, this process will substantially reduce the overall cost of the tag. This class of glass substrate embodiments will also be subject to the reliability problems of the prior art in high temperature applications because of the mismatch in the coefficients of thermal expansion between the glass substrate of the RFID tag transceiver and plastic substrate upon which the antenna is formed.

DETAILED DESCRIPTION OF THE PREFERRED AND ALTERNATIVE EMBODIMENTS

Figure 1:
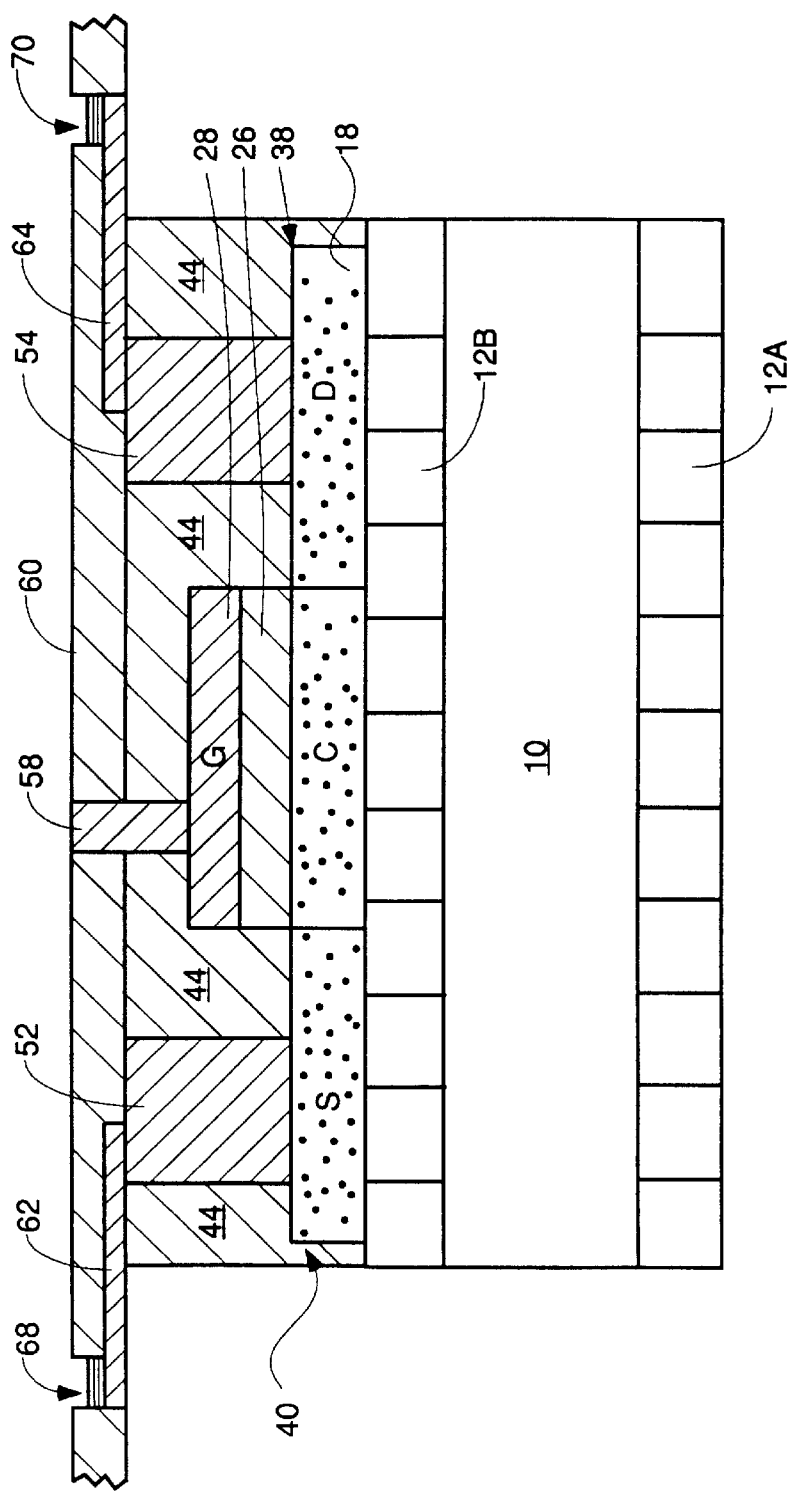
FIG. 1 is a symbolic cross-sectional drawing of a "right side up" thin film transistor representing the RFID tag IC integrated directly on a plastic substrate above an antenna which is formed on the plastic substrate.

Referring to FIG. 1, there is shown a cross-sectional drawing of a "right side up" thin film transistor representing the RFID tag IC integrated directly on a plastic substrate above an antenna which is formed on the plastic substrate view of a first embodiment. Those skilled in the art appreciate that neither an RFID tag or smart card circuit can be built with a single transistor. However, the processes taught herein can be used to fabricate the 200–10,000 gates needed for an RFID tag since all these devices can be fabricated from layers of silicon dioxide, amorphous silicon, nitride, aluminum or other metals simply by changing the masks to implement whatever circuit is desired. There are disclosed herein processes for forming oxide, nitride, amorphous silicon and polysilicon semiconductor layers and metallization layers and processes for crystallization of the amorphous silicon layers and doping thereof, all at temperatures which are low enough so as to not melt the plastic of the substrate.

A plastic substrate 10 serves as the basic structure in this embodiment which will provide mechanical support for both the antenna and the RFID tag transceiver IC that will be integrated on the substrate. In some embodiments, this plastic substrate will be PET (polyethylene terephthalate or polyester) and in other embodiments it will be polyimide or some other plastic such as PES (polyether-sulphone). The choice of plastic usually depends upon the application for the tag. The melting temperature of PET is approximately 120 degrees C. whereas the melting point of polyimide is approximately 250 degrees C. PES melts approximately at 200 degrees C.

Figure 2:
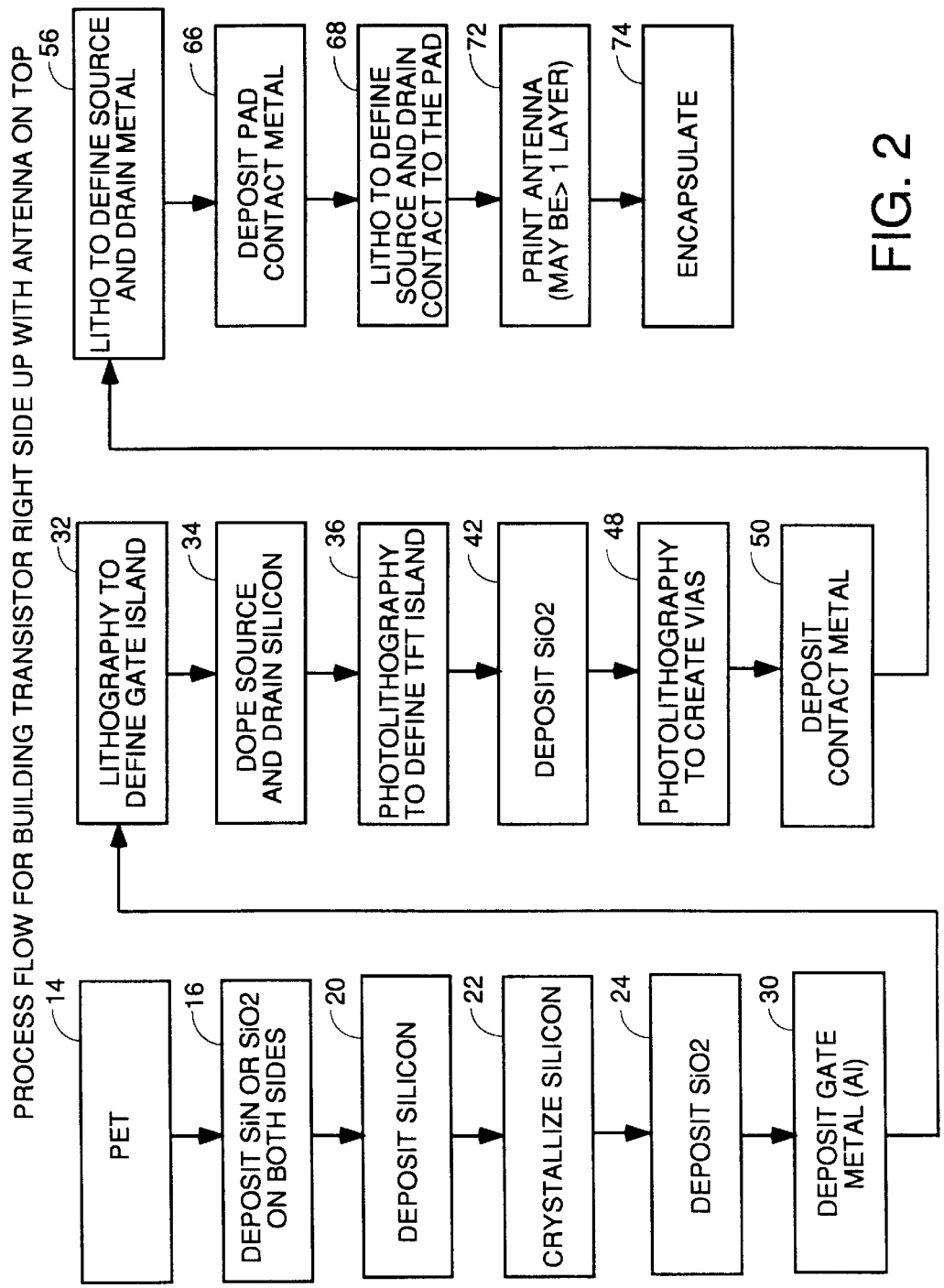
FIG. 2 is a process flow schedule for a process to make the structure of FIG. 1.

FIG. 2 represents a process flow to make the structure of FIG. 1. Note that FIG. 1 shows only a single self-aligned thin film MOS transistor whereas the RFID tag requires that a data processor section, a memory section and an RF transceiver circuit all be integrated into the IC. Since the actual circuitry of the RFID transceiver is not part of the invention, this disclosure will focus only on the processes and structures of fully integrated RFID tags for the first class of embodiments and RFID tags constructed by the "cut and paste" method using transceiver ICs that have been manufactured cheaply using flat panel display processes. FIGS. 1 and 2 represents examples of the structure and process representative of the first class of embodiments. Step 14 represents the step of selecting the substrate plastic for the application in which the tag will be used. The substrate is preferably sized so as to be the largest size that will fit within flat panel display manufacturing equipment that will be used to perform the deposition, photolithography, etching and ecimer laser crystallization and annealing steps to be described subsequently. The thickness and material of the substrate is picked with an eye toward the eventual service the integrated circuit formed thereon will be asked to perform and the environment in which it will perform said service. The term "large size" as used in the substrate is meant to indicate such a plastic substrate which can be processed by the flat panel display manufacturing machines. In this particular case, PET has been selected. Typical thickness for the substrate is from 0.1 to 0.25 millimeters. Sizes of the substrates that can be processed in the flat panel display manufacturing machines are constantly increasing, and the large size substrate picked is intended to mean the largest size which flat panel display manufacturing machines of the most current generation can handle, or sizes which earlier generations of flat panel display manufacturing machines (which will be cheaper to acquire) can handle.

The key to avoiding reliability problems caused by differential thermal expansion is to coat the plastic substrate with a layer of silicon nitride (hereafter nitride) or silicon dioxide (hereafter oxide) or other material at a predetermined thickness to get matching strain values between the plastic substrate and the coating layer. The thickness of the nitride or oxide layer 12A and 12B in FIG. 1 must be selected such that the "strain" (the amount of deformation under thermal stress) in the oxide or nitride layer substantially (within 5–10%) or exactly matches the corresponding strain of the substrate 10 at the temperature of the operating environment given the geometry and material of the plastic substrate. Also, the oxide or nitride must be applied to both sides of the plastic substate to avoid bowing the substrate at temperature.

Thus, the key to eliminating the reliability problems at high temperatures is to avoid differential strain which is so large as to cause fracturing, failure of the circuit electrically or mechanically or other reliability problems. The key to this is to avoid large mismatches in the amount of strain that occurs between the plastic substrate on which the antenna is fabricated and the material on which the transceiver is fabricated and which is bonded to or integrated on the antenna bearing substrate at temperatures within the anticipated operating temperature range. This is the meaning of the phrase "reduce differential strain at anticipated operating temperatures so as to eliminate or reduce reliability problems".

The amount of strain that occurs in a material in thermal expansion is a function of its Young's Modulus, the temperature and its geometry, especially its thickness. The trick then is to establish the thickness of the nitride layer (or whatever other material is chosen) so as to establish a "strain" value which substantially matches within about 5–10% or, preferably, exactly the strain value of the underlying plastic substrate at the same temperature given the geometry and material of the substrate. Nitride is a good choice for layers 12A and 12B because it has a high Young's Modulus so a thin layer, usually about 1000–2000 angstroms will cause the strain match desired at most operating temperatures experienced by RFID tags. Step 16 represents the process of depositing the right amount of nitride or oxide (or some other material) to achieve the strain match described above. This must be accomplished by a low temperature step with a maximum temperature below the melting point of the substrate 10. The nitride or oxide layers 12A and 12B can be sputtered on or deposited by a physical vapor deposition (PVD) or plasma enhanced chemical vapor deposition process (PECVD), all of which are known in the art and which may be performed at temperatures below 100 degrees C.

Low temperature processing steps to deposit PECVD silicon dioxide, nitride, gate oxides, amorphous silicon and aluminum on a PET substrate while limiting temperatures to less than 100 degrees C. are disclosed U.S. Pat. Nos. 5,817,550 and 5,346,850, both assigned to the University of California, and in a paper by scientists at Lawrence Livermore National Labs, Theiss et al., *Polysilicon Thin Film Transistors Fabricated at* 100 *degrees C. on a Flexible Plastic Substrate,* International Electron Devices Meeting Technical Digest, Page 257–260, 1998 the teachings of all of which are hereby incorporated by reference. IBM owns U.S. Pat. No. 5,796,121, the teachings of which are hereby incorporated by reference. This patent teaches methods and materials suitable to build a thin film transistor structure suitable for a flat panel display on inexpensive, clear plastic substrates such as Lexan® (polycarbonate). This IBM patent also teaches methods and materials to build multilayer TFT structures which will not delaminate, and an "upside down" TFT structure.

The IBM process uses processing steps that are low temperature and uses materials which will not attack or otherwise damage the plastic. The IBM process encapsulates Lexan or cyclic olefin copolymers (Topas™) with glass transition temperatures from 120 to 200° C. with an amorphous encapsulation film that covers the top, bottom and sides. This encapsulation film for an RFID tag, smart card or toy IC, must be an insulator, and resistant to attack by strong acids, strong bases and petrochemical and other solvents, smooth and pinhole free and must adhere well to the plastic substrate during thermal cycling from 125 to 150° C. Thermally cured SHC 1200 Hard Coat and UV cured UVHC 8558 Hard Coat available from GE Silicones and Vitrinite™ available from Metroline Industries, Inc. possess the above characteristics. Coating of the substrate with GE Silicones SHP 401 primer before applying the Hard Coat provides the best adhesion. The claims use the phrase "at a temperature below the glass transistion temperature of said plastic substrate" or words to that effect. These phrases are intended to indicate the use of temperatures at, above or below the glass transition temperature of the particular plastic substrate selected so long as the dwell time at temperatures at or above the glass transition temperature are not long enough to cause any melting, warping, bowing, deformation or other damage to the plastic substrate.

The upside down TFT structure of FIG. 2 of the IBM patent is built in the following manner and may be adapted for use in the RFID tag or smart card applications if modified according to the teachings herein to add an antenna and suitable leader lines above the Hard Coat and prior to beginning construction of the TFT device. Gate metal from the group Cr, Ta, Mo, W and Cu and alloys thereof are next applied over the Hard Coat and patterned with Cr preferred. Next, three layers are applied in a reactor. First, a layer of gate dielectric, preferably amorphous silicon nitride is deposited at about 125° C. by the SiNitride PECVD process. Next, a layer of semiconductor for the channel is deposited at 125° C. by the a-Si:H PECVD process to form a layer of hydrogenated amorphous silicon (a-Si:H). Next, a layer of amorphous SiNitride is deposited by the same PECVD process used to deposit the gate dielectric. The amorphous SiNitride is then photolithographically patterned and etched to expose the semiconductor layer outside the island and a layer of phosphorous doped N-type a-SiH silicon is deposited by PECVD. Alternatively, a low work function metal such as magnesium or yttrium may be used. A layer of metal such as Al, Cr or Ta is then deposited by evaporation or sputtering over the N-type a-SiH silicon layer. These last two conductive layers are then patterned photolithographically to form the desired interconnects. The finished structure can then be passivated. The structure for this upside down transistor can also be used as an alternative embodiment for the process used to build the structure shown in FIG. 3 herein if the leader lines 92 and 94 are formed first on the Hard Coat followed by formation of antenna 88 in FIG. 3 herein, and if the vias at 108 and 110 are formed through the IBM transistor insulation layer 58 in FIG. 2 of the IBM patent. The same can be said for the structures of FIGS. 3 and 4 of the IBM patent.

Figure 4:
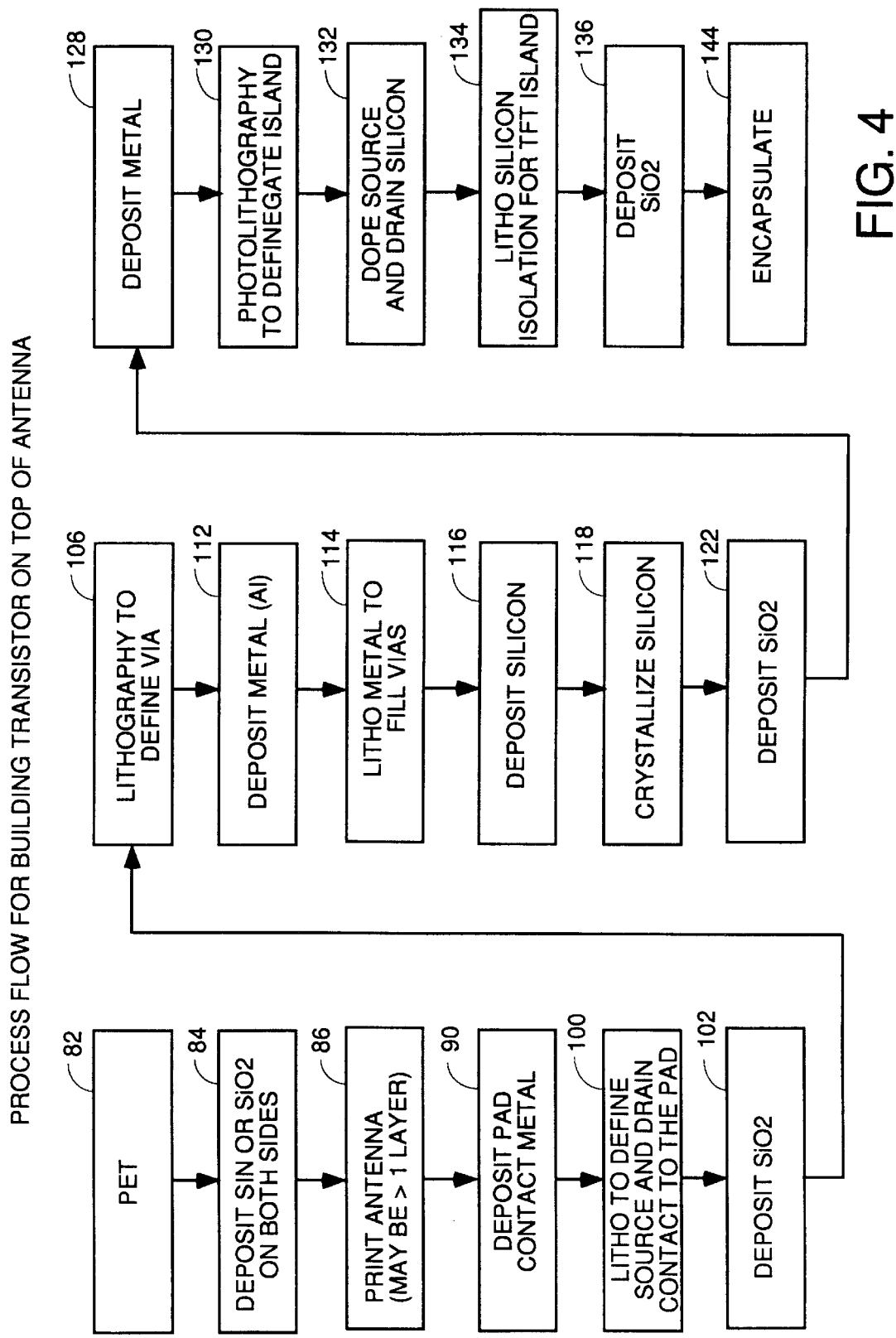
FIG. 4 is a process flow schedule for a process to make the structure shown in FIG. 3.
Figure 5:
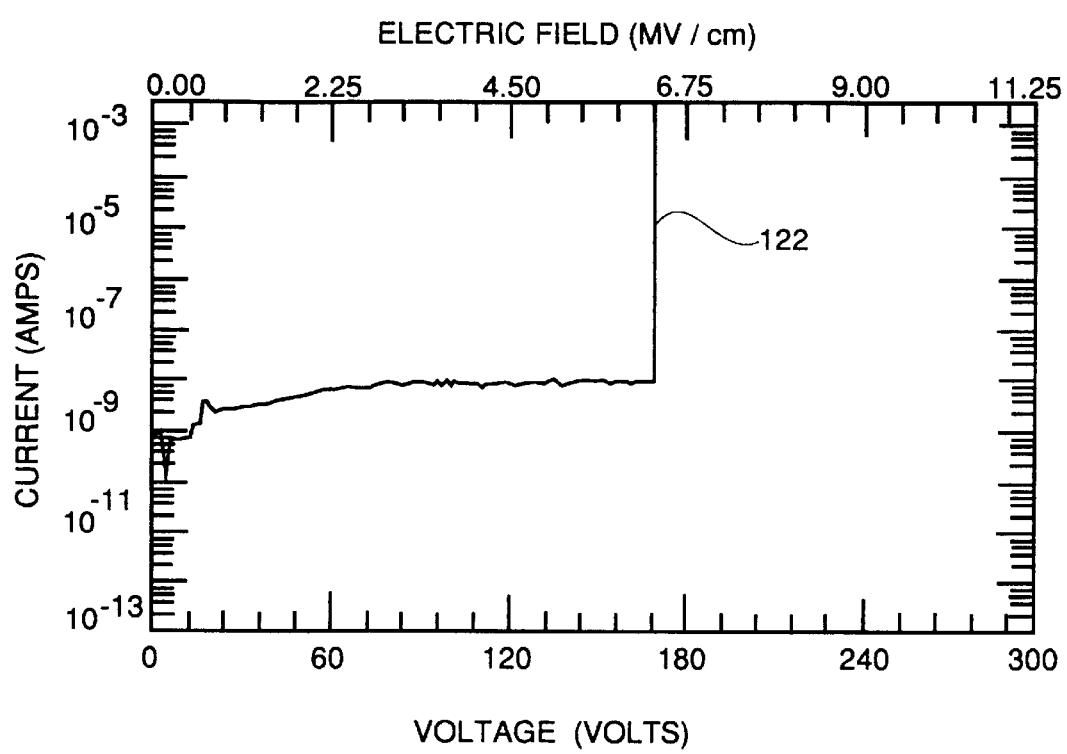
FIG. 5 shows the leakage current, curve 120, and the current breakdown, curve 122, at 6.4 MV/cm for capacitors made by the low temperature IBM PECVD process.

The PECVD process IBM taught to deposit the dielectric layers is as follows. A PECVD process to deposit dielectric layers 58, 62, 78, 82, 100 and 104 in FIGS. 2, 3 and 4 of the IBM patent is the following SiNitride process. The dielectric may be an amorphous Si, N, H alloy. The preferred process is to place the plastic substrate containing the patterned gate layer in a reactor at a temperature of 125° C. in a gas mixture at a pressure in the range 0.1 to 1 Torr, the optimum pressure being 0.6 Torr. The gas mixture contains helium, nitrogen, ammonia and silane and the total gas flow is between about 500–2000 sccm with the optimum being about 875 sccm. For He/silane the flow ratio is between about 20/1 to 100/1, preferably about 60/1; for nitrogen/silane it is between about 15/1 to 25/1, preferably about 20/1; and for ammonia/silane it is between about 1.2/1 to 2/1, preferably about 1.5/1. The preferred RF Power/area is about 0.05 Watts/cm$^2$, and may be in the range 0.03 to 0.1 Watts/cm$^2$. Aluminum gate capacitor structures (here Al/SiNitride/Al) having a SiNitride dielectric film 2,670 Angstroms thick were made using this process. These capacitors exhibited a breakdown field of 6.4 MV/cm, and leakage current at 1.1 MV/cm field of 6×10$^{-9}$ Amps/cm$^2$. FIG. 5 shows the leakage current, curve 120, and the current breakdown, curve 122, at 6.4 MV/cm for these capacitors. These data show that this low temperature PECVD process is capable of depositing SiNitride having dielectric characteristics equivalent to those made by higher temperature PECVD processes utilizing different gas mixtures and other process parameters.

Figure 6:
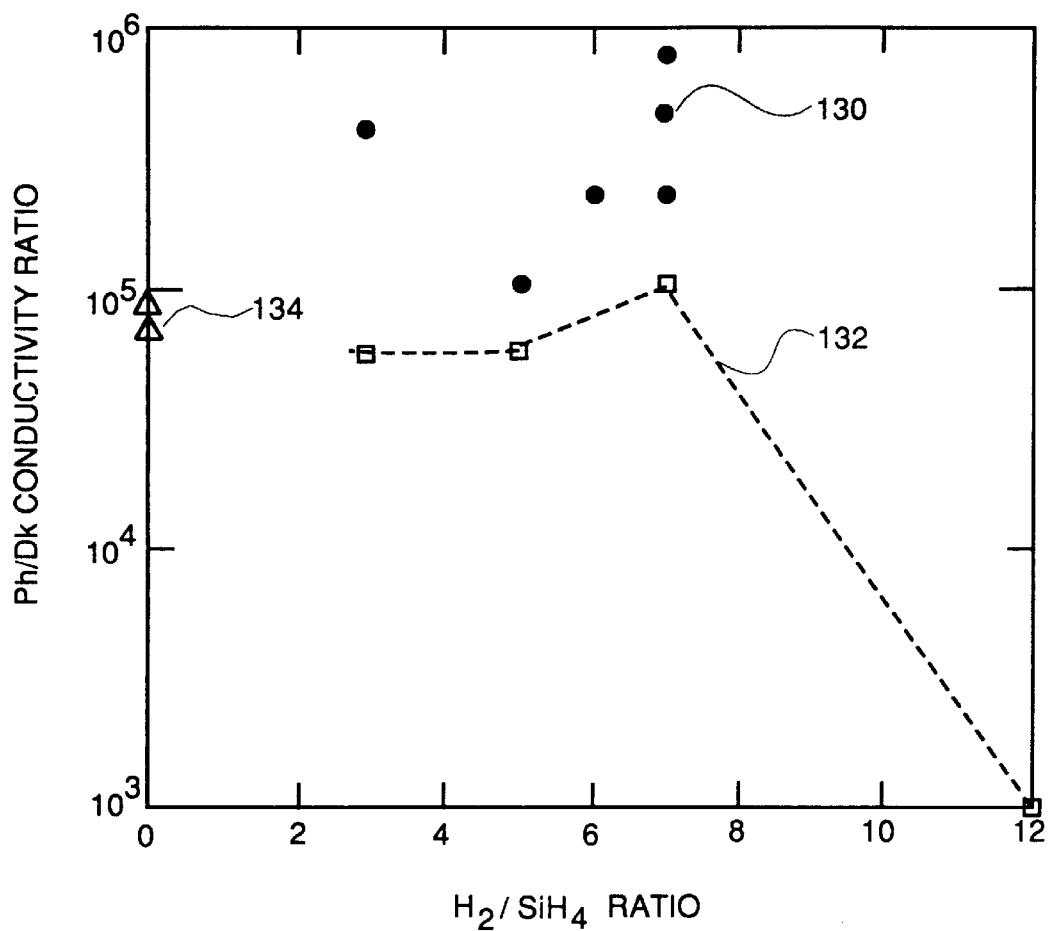
FIG. 6 shows the ratio of photo/dark conductivity plotted vs. hydrogen/silane ratio for the layer of a-Si:H made by the IBM low temperature PECVD process.

A PECVD process to deposit the a-Si:H channel layers 60, 80 and 102 in FIGS. 2, 3 and 4 of the IBM patent is as follows. The preferred process is to place the plastic substrate in a reactor at a temperature of 125° C. and in a gas mixture at a pressure in the range 0.5 to 1.5 Torr, the optimum pressure being 1.0 Torr. The gas mixture contains He, hydrogen, and silane and the total gas flow is in the range of about 300–500 sccm, preferably about 350 sccm. For He/silane, the flow ratio is between about 10/1 to 50/1, preferably 20/1 and for hydrogen/silane it is between about 3/1 to 8/1, preferably 7/1. The preferred RF Power/area is about 0.03 Watts/cm$^2$ and may be in the range 0.02 to 0.05 Watts/cm$^2$. The resulting a-Si:H layers exhibit an optical gap of 1.85 eV, a refractive index of 3.86 and a hydrogen content of 20% with only monohydride bonding as characterized by infrared absorption spectroscopy and exhibit a ratio of photo/dark conductivity consistently>100,000. Both of these measurements are unchanged with several months time. FIG. 6 shows the ratio of photo/dark conductivity plotted vs. hydrogen/silane ratio. The photoconductivity was measured with a light fluence of about 0.1 Watts/cm.sup.2. The dark conductivity was measured inside a light tight metal box. The data points labelled 130 identify the preferred Hydrogen/Silane ratio. The dashed line labelled 132 shows the resulting ratio of photo/dark conductivity with no He used (i.e., only hydrogen). The data points labelled 134 illustrate the resulting ratio of photo/dark conductivity with no hydrogen (only He) used. These data show that this novel low temperature PECVD process is capable of depositing a-Si:H layers having semiconducting characteristics equivalent to those made by higher temperature PE CVD processes utilizing different gas mixtures and other process parameters.

The IBM patent teaches a low temperature way of forming a high quality gate dielectric characterized by leakage current density of less than about 1×10$^{-8}$ amps/cm$^2$ and breakdown electric field of greater than 5 MV/cm and deposited at temperature of less than the glass transition temperature. Any other processing step that can form a layer of dielectric of this quality at a temperature below the glass transition temperature of the plastic substrate will also work for this step.

The IBM patent teaches ways of deposition of an amorphous siicon layer having mid-gap defect densities of the order of 10$^{16}$/cm$^3$ or less deposited at a temperature glass transition temperature of the plastic substrate. Any other process that can deposit a silicon layer of this quality at a temperature glass transition temperature of the plastic substrate will also work.

Olin Corporation owns a U.S. Pat. No. 4,877,641, the teachings of which are hereby incorporated by reference which teaches a low temperature way of depositing silicon nitride-type or silicon dioxide-type films on a substrate using temperatures from about 100° C. to about 350° C. This process can be used as an alternative step to form the needed oxide and nitride layers in the IC being integrated onto a large plastic or glass substrate in place of the steps described elsewhere herein in alternative embodiments so long as the temperature of the deposition is not above the glass transition temperature of whatever plastic substrate is selected. This process involves introducing di-tert-butylsilane and at least one other reactant gas into a CVD reaction zone containing the substrate on which the either a nitride or oxide film is to be formed, and maintaining the temperature of the zone and the substrate between 100° C. to about 350° C. and below the glass transition point of the substrate and maintaining the pressure in the zone from about 0.1 to 5 Torr. Then passing the gas mixture into contact with the substrate while exciting the gas mixture with a plasma for a period of time sufficient to form a silicon nitride-type or silicon dioxide-type film on the substrate with the plasma being excited by RF power at about 10 to 500 watts.

Another alternative embodiment of the processes described herein to form thin film transistors is to use flat panel display semiconductor processing equipment to practice a low temperature process of forming thin film transistors in amorphous silicon using DC reactive magnetron sputtering. This process is described in a paper by McCormick et al., *Low Temperature Fabrication of Amorphous Silicon Thin Film Transistors By DC Reactive Magnetron Sputtering*, J. Vac. Sci. Technol. A 15(5) September/October 1997, pp. 27702776 (May 1997), which is hereby incorporated by reference. This paper teaches deposition steps to deposit hydrogenated amorphous silicon and hydrogenated amorphous silicon nitride films using DC reactive sputtering at 125 and 230° C. substrate temperatures. Metal-insulator-silicon transistors fabricated with this method on c-Si show electrical leakage of less than 5×10$^{-8}$ A/cm$^2$ at 3 MV/cm field, flat band voltage magnitude of less than 1 volt, and hysteresis of less than 2 volts. Multiple inverted thin film transistors can be fabricated by this method on plastic substrates. Thin film transistors deposited at 125° C. have field effect mobility of 0.3 cm$^2$/V.second and an $I_{on}/I_{off}$ ratio of 5×10$^5$, and a threshold ratio of 3 volts.

The illustration in the figures of the preferred processes to be described next assumes only one transistor is being built, but those skilled in the art will appreciate that the following process steps apply equally to simultaneously building all the transistors needed to make an RFID transceiver by suitable fabrication of the masks. The following process is to be carried out simultaneously on large plastic substrates that can be processed by flat panel semiconductor processing machines to build thousands or even millions of RFID tag transceivers simultaneously thereby lowering the per unit cost.

Step 20 represents the process of depositing a layer of amorphous silicon semiconductor 18 having a thickness of from 10–500 nanometers. The silicon can be sputtered on or deposited by PECVD at a temperature of about 100 degrees C. Transistors can be built in amorphous silicon, but they are not high speed transistors because mobilities, carrier lifetimes and other properties of amorphous silicon are not conducive to constructing high speed transistors. Fortunately, RFID tags do not need to be fast for most applications, so there is no need to improve the properties of the silicon. However, where higher performance transistors are desired, the silicon may be cyrstallized to polycrystalline or microcrystalline form by pulse annealing it with an XeCl excimer laser having a 308 nm wavelength. Typically, pulse durations of 30 nsec or less full width at half maximum per pulse are used with an energy density of 30–600 mJ/cm$^2$ per pulse, typically around 150 mJ/cm$^2$. This optional crystallization step is step 22 in FIG. 2. Irradiating the silicon layer 18 with one or more pulses will partially or completely crystallize the silicon film producing a fully or partially crystalline channel poly-Si (hereafter poly) TFT. The TFT device constructed in this layer of poly will have higher ON currents, higher mobilities and lower threshold voltages than TFTs with an amorphous silicon channel.

Step 24 represents the process of depositing a layer of oxide which will become the gate oxide 26. This layer is typically 20–500 nm thick and is deposited by PECVD at about 100 degrees C. (sputtered oxide has not yet been shown to be of high enough quality for gate oxide). In alternative embodiments, the gate oxide 26 may also be nitride or a combination of nitride and oxide.

Next, a layer of gate metal such as aluminum that will become gate 28 is deposited, as symbolized by step 30. The gate metal layer is typically from 50–1000 nm thick, and is deposited by any suitable deposition technique such as PVD, CVD, evaporation or sputtering. Other metals or alloys such as Cu, Ni, Ti, Mo, Cr, Ta, W, Ti—Si, Ti—Al, Al—Si and Al—Cu can also be used. Also, doped silicon and silicides (silicon alloyed with a refractory metal) may also be used for the gate 28.

Step 32 represents the photolithographic definition of the thin film "island" containing the gate and gate oxide. This is done by conventional photolithography as modified for the plastic substrate. A typical example of such a process is as follows and will be referred to in the claims as "photolithographically etching" although this phrase is intended to cover all combinations of wet or dry type etching processes that are compatible with the plastic substrate chosen or at least which will not attack the coating that covers the plastic substrate and which will etch down through the layers above the semiconductor layer by one or more etching steps to leave the portions of the semiconductor layer exposed where source and drain doping is to occur:

1) bake the substrate containing the metal and gate oxide layers at 90 degrees C. for 2 to 10 minutes;
2) spin on 1.4 micrometers of photoresist (a wide range of thicknesses from 0.5 to 2.5 micrometers is acceptable for this step);
3) prebake the photoresist coated substrate at 90 degrees C. for 2 minutes;
4) expose the TFT gate pattern on the photoresist using a mask aligner;
5) develop the pattern using standard resist developer; and
6) postbake the substrate at 90 degrees C. for 5 to 60 minutes;
7) the gate pattern is defined using standard wet chemical and/or plasma etching techniques. An example of how to do this follows. The exposed Al film is etched by immersion in Al-Type II etch manufactured by Ashland Chemical, for 5 minutes or until etching is complete, leaving an area of metal film as shown at 28 in FIG. 1. This is followed by a deionized water rinse. The etching time will vary with the thickness of the gate film and the etch bath temperature which should be between 25 to 60 degrees C. Other wet chemical or dry chemical etches may also be substituted. Next, the sections of the gate oxide layer exposed by the metal etch are removed by immersion for 40 seconds in a well known etchant for etching oxide over semiconductor or contact metal, such as KTI Pad Etch I manufactured by Ashland Chemical. This leaves an area of gate oxide as shown at 26 in FIG. 1. The etching time will vary with oxide thickness. Other wet or dry chemical etches may be substituted for this step. Finally, the remaining photoresist is removed using standard solvent and/or photoresist chemicals, followed by a rinse step.

Figure 3:
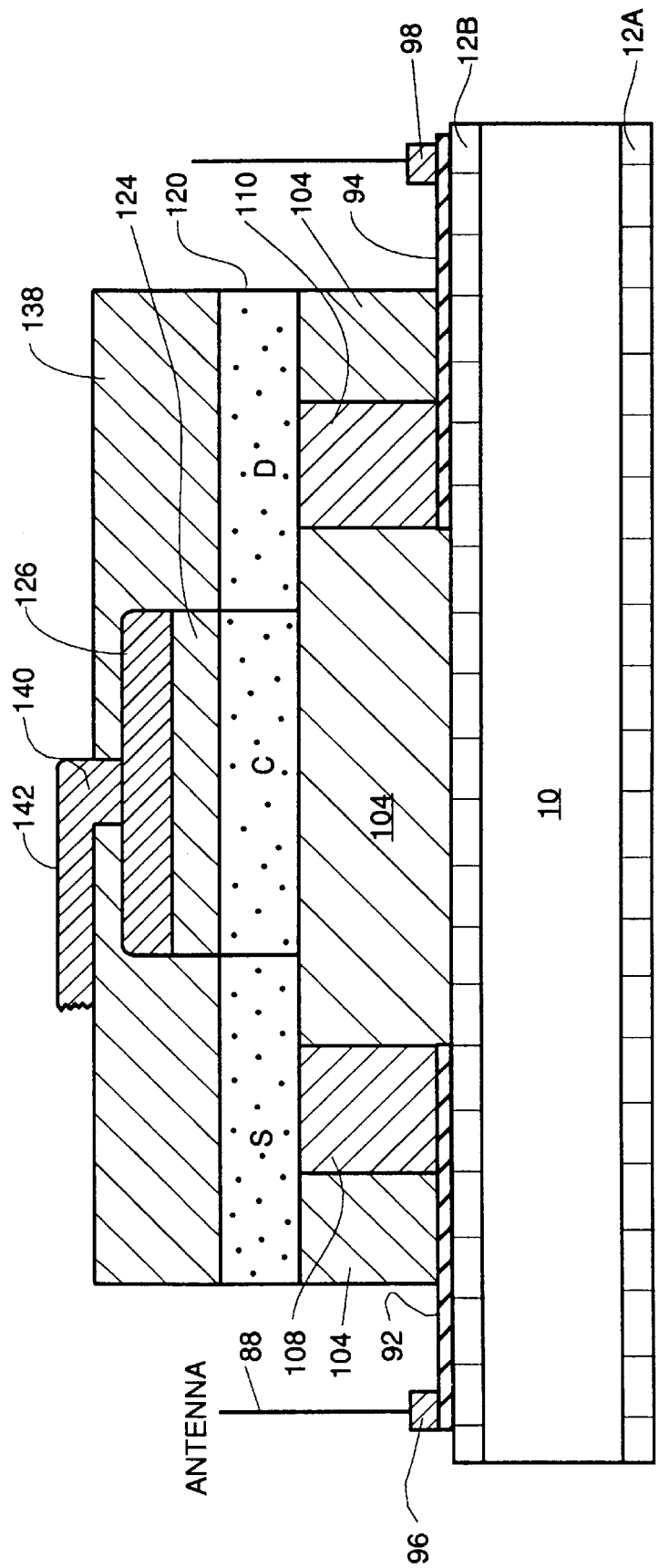
FIG. 3 is symbolic cross-sectional view of an upside down MOS transistor integrated onto a plastic substrate over an antenna that has previously been integrated onto the same substrate.
Figure 8:
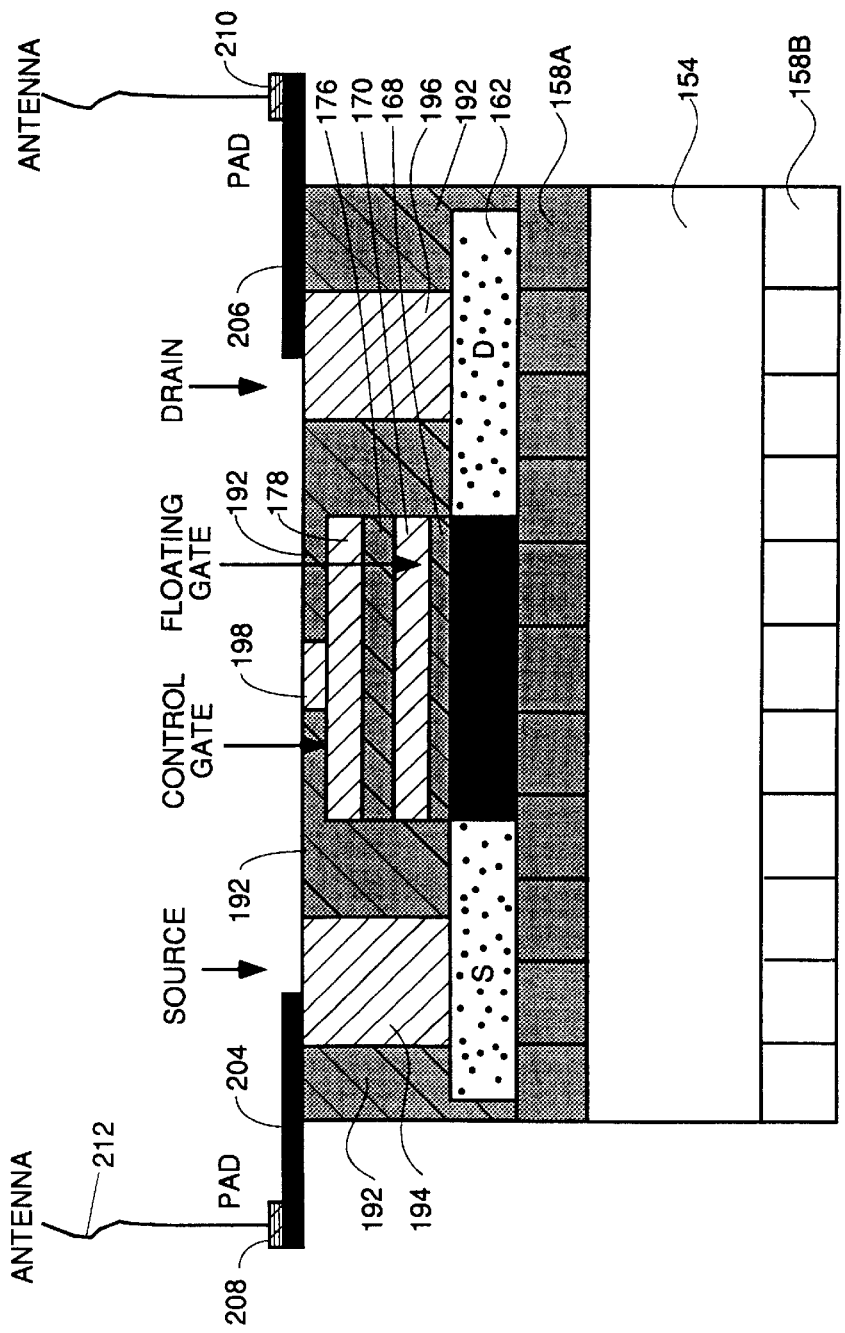
FIG. 8 is an exemplary structure built by the process of FIG. 7.
Figure 10:
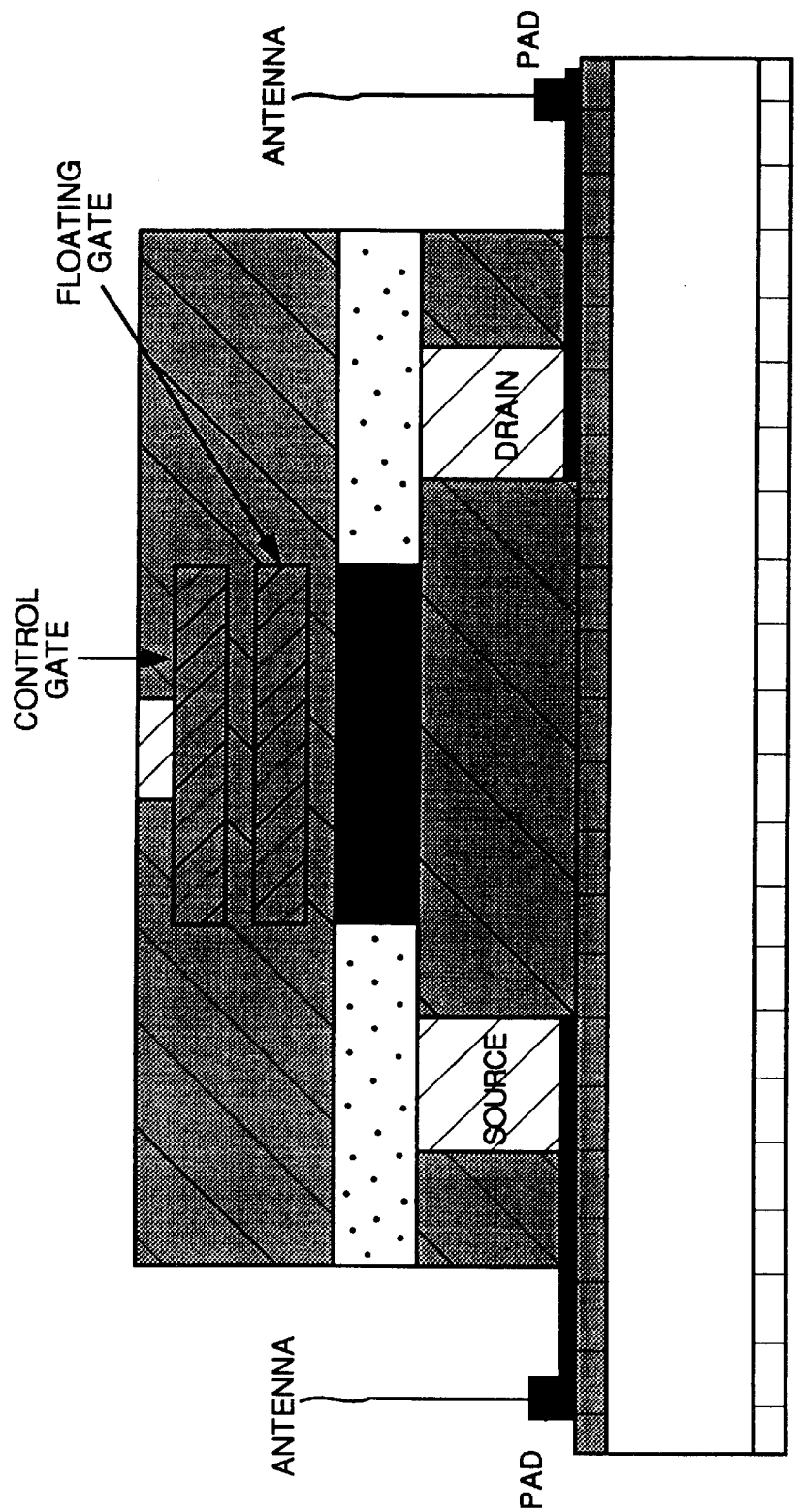
FIG. 10 is an exemplary structure which results from the process of FIG. 9.

This "photolithographic etching" process forms the "gate island" which in the claims means the islands comprised of the gate 28 and gate-channel insulator 26 in FIG. 1 or the or gate 126 and insulator 124 in FIG. 3 or gate 178, insulator 176, floating gate 170 and insulator 168 in the EEPROM cell of FIG. 8 and the corresponding structures in FIG. 10. The above defined photolithographic etching process can be modified for making the EEPROM cell gate islands by addition of additional metal etch and insulation layer etch steps to define the floating gate and the insulator between the floating gate and the channel region.

Dry etches can be easily made anisotropic, so they are preferred if density of the ICs on the substrate is to be accomplished to lower the cost per unit since wet etches are more difficult to make anisotropic. However, where ICs for RFID tags are being made, the antenna size usually establishes the minimum size for the substrate so packing the ICs together more on the large substrate may not be needed, especially if it reduces yield.

Step 34 represents the process of crystallizing and doping the source and drain regions marked S and D in layer 18 of FIG. 1. This is done using Gas Immersion Laser Doping (GILD) as described by P. G. Carey et al., IEEE Electron Devices Lett., Vol. EDL-7, No. 7, pp. 440–442 (1986). An example in this class of processes is as follows:

1) the thus processed plastic substrate is exposed to oxide etchant vapor such as HF vapor for several seconds, typically from 2–30 seconds to remove any native oxide from the exposed silicon layer 18;
2) the thus processed plastic substrate is then placed in a gas cell evacuated to a base pressure on the order of 3 mTorr and subsequently filled to about 300 Torr with a dopant gas, for the GILD process. Typical gases are $PF_5$, $BF_3$, $B_2H_6$, $PH_3$, $AsH_3$ and $AsF_5$. Other base and dopant gas pressures may also be used. This creates a dopant layer on top of the silicon.
3) the resulting dopant film and the underlying silicon is then irradiated with several (2 to 1000) of laser energy at several laser fluences, increasing in steps from about 135 $mJ/cm^2$ to about 270 $mJ/cm^2$ for a time duration of from 10 to 150 ns/pulse. The range of laser fluences will vary depending upon the exact layer thicknesses of the dopant and the underlying silcion and dopant materials selected. The ultimate range of laser fluences could be as wide as 30–600 $mJ/cm^2$. This laser heating locally remelts the silicon again and drives the doping materials into the poly to created doped source and drain regions. This Excimer Laser Annealing (ELA) step will result in two different device structures depending upon whether optional step 22 in FIG. 2 was or was not performed. If step 22, was not performed, then step 34 results in doped polysilicon (poly) source and drain regions S and D in FIG. 1 on either side of an undoped amorphous silicon channel region C. If optional step 22 was performed, then step 34 results in doped poly source and drain regions S and D on either side of an undoped poly channel region C. Other alternative methods for providing the doping may also be used such as predeposited dopant film followed by excimer laser annealing. To dope the source and drain regions P+, a layer of boron hydride should be deposited followed by ELA. To dope the source and drain regions N+, a layer of phosphorous bearing compound should be deposited followed by ELA. Ion implantation followed by ELA could also be used as could low temperature CVD to do the doping.

Step 36 represents the process of photolithographically defining the "thin film transistor island" or TFT island. What this means is photolithography and etching is performed in the manner described previously so as to define the lateral extents at 38 and 40 in FIG. 1 of the source and drain regions to isolate each MOS transistor from its neighboring devices. It means the same thing at the locations of any EEPROM or ROM cells being formed simultaneously on the same substrate. This, prevents one transistors source and drain from being inadvertantly connected to the source or drain of neighboring devices. The photolithography is performed so as to not exceed the melting point of the plastic substrate during baking of the photoresist, and wet or dry etchants capable of etching poly are used to etch through the poly layer 18 down to the nitride layer 12B.

Step 42 represents the process of depositing an insulating layer such as the oxide shown at 44 to isolate the thin film transistor island from surrounding structures. Via holes are etched through this layer in step 48 to allow contacts to the source and drain layers to be formed. The insulation layer deposition step can be by the same process as used for step 24.

Step 50 represents the step of depositing a layer of "contact metallization conductor". As used in the claims, this term means depositing a layer of conductor which is usually metal but which could also be other conductors and which fills the via holes to form contacts 52 arid 54 to the source and drain regions S and D in FIG. 1 and contact 58 to the gate and which covers the areas between devices so that it can be etched into a metallization pattern which connects the devices together appropriately to accomplish the desired function for the integrated circuit. Although the gate contact is shown extending up through another insulation layer 60 that covers the antenna contact leader lines 62 and 64, in reality, the gate contact metalization usually extends on top of insulation layer 44 over to another transistor source, gate or drain contact to implement the tag transceiver circuit. Step 56 represents photolithographically etching the metal layer to form the contact metallization pattern the connects the varius transistors of the tag transceiver together.

The details of the processes represented by steps 42, 48 and 50 are as follows.

First, a layer of photoresist is spun on, exposed and developed as described previously for the steps of defining the gate. The resulting exposed silicon from layer 18 is then etched away using an $SF_6$ plasma etch, and the remaining photoresist is removed. Other low temperature wet or dry etch processes capable of etching poly may be substituted.

Next, the contact isolation film 44 is deposited. This film can be oxide or nitride having a thickness typically in the range from 20–1000 nm with 80–140 nm being the usual thickness. This layer is deposited by PECVD at 100 degrees C. Oxide adhesion to the silicon may be enhanced by an oxygen plasma exposure before the insulation layer deposition, followed by a plasma etch cleaning step in the PECVD reactor for about 10 seconds or more to remove any residual photoresist which may have been cured by exposure to ultraviolet light in the previous step.

Next, a contact via pattern is defined using standard photolithographic techniques as defined above for the gate definition. Typically, the via holes are formed by etching the exposed oxide film by immersion in KTI Pad Etch I etchant for 40 seconds followed by a deionized water rinse. Other compatible wet or dry etches may be substituted. The remaining contact via hole photoresist is then removed using solutions such as acetone and isopropyl alcohol.

Next, a layer of aluminum or other contact metal for the contact metallization pattern is deposited. This film has a typical thickness range from 100–2000 nm with 800–100 nm being the norm. The aluminum layer is deposited using PVD with a sputter or etch cleaning performed in situ immediately prior to the deposition. The metalization pattern to make the interconnections needed between the various transistors of the RFID tag transceiver is then defined using the photolithographic techniques described above for definition of the gate area. The exposed metal is then etched by immersion in Al-Type II etch for 10 minutes to implement step 56 in FIG. 2. The etching time will vary with thickness of the aluminum layer and the etch bath temperature (typically 25–60 degrees C.). Other compatible wet or dry etches may also be used. Finally, the remaining photoresist is removed.

Step 66 represents the process of depositing another layer of metal on top of insulation layer 44 to form the antenna contact leader lines 62 and 64. Step 68 represents the process of photolithographically etching the newly deposited metal layer to define the leader lines 62 and 64 to extend from the source and drain contacts 52 and 54 over to pads 68 and 70 which will serve as contact points for connection to the antenna. In some embodiments, steps 66 and 68 are omitted and the leader lines 62 and 64 are formed as part of the contact metallization pattern formed by step 56. Steps 66 and 68 are accomplished by the deposition and photolithography processes described herein or equivalents.

Steps 72 and 74 represent the processes of printing the antenna metal (or photolithographically defining the antenna) so as to make contact with the pads 68 and 70. A thin layer of silver at pads 68 and 70 can be deposited to prevent electrolytic corrosion at the pads in the case of different metals for the leader lines 62 and 64 and the metal of the antenna. Step 74 represents the encapsulation of the transceiver IC with some conventional protective material.

There are listed below some variations of the above described process.

1. Replacement of the reflective Al gate with a UV-absorbing gate material, such as silicon, to heat the channel/gate dielectric interface, improving interface properties.

2. Replacement of the Al gate and Al interconnect metalization with a metal or alloy of a different electrical conductivity, such as Cu, Mo, Cr, Ta, W, Ni, Ti, Ti—Si, Al—Si, Al—Cu, Ti—Al, and other alloys with Si, such as silicides.

3. Suitable dielectric layers include silicon nitride and polyamide as well as $SiO_2$.

4. The addition of a bottom-gate silicon TFT process.

5. Low temperature hydrogen passivation of the channel region, either before or after the gate oxide and gate metal depositions.

6. Irradiation of the metalization film to improve metal/silicon contact interface.

7. A predeposited dopant film may be used in place of the doping step.

8. Any of the deposition steps (PECVD, PVD, evaporation, and sputtering) could be replaced by other chemical, physical, ablation, vapor-phase or liquid-phase deposition processes provided the substrate temperature is not allowed to exceed 150 degrees C. for an extended period of time (for example 50 ns to a few seconds ($0.5 \times 10^{-7}$ to 2 seconds).

9. For the crystallization and doping steps, instead of using an XeCl pulsed excimer laser (wavelength of 308 nm) with a full width at half maximum of intensity (FWHM) of about 35 ns, there can be substituted XeCl excimer lasers with different FWHM values (15–50 ns), or other excimer lasers such as ArF ($\lambda$=193 nm), KrF ($\lambda$=248 nm), or XeF (wavelength=352 nm). In addition, solid state pumped Nd:YAG lasers will also be suitable as irradiation sources. Other pulsed energy beam sources, such as pulsed ion beams or $CO_2$ lasers, could also be used in place of the excimer laser. The dopants may be added by other techniques, such as CVD, ion shower, ion implantation, then excimer laser annealed to drive in the dopants and crystallize the silicon.

Various low-temperature plastic substrates (both flexible and rigid) may be used, including: poly(ethylene terephthalate) (PET), ethylene-chlorotrifluoro ethylene (E-CTFE), made under the trademark HALAR by Ausimont U.S.A., Inc., ethylene-tetra-fluoroethylene (E-TFE) made under the trademark TEFZEL by Dupont Corporation, polyethersulfone (PES), poly-tetra-fluoro-ethylene (PTFE), fiber glass enhanced plastic (FEP), and high density polyethylene (HDPE).

Referring to FIG. 3, there is shown a cross-sectional view of an "upside down" thin film transistor structure useful for building the RFID tag transceiver on top of the antenna formed on the substrate. FIG. 4 is a process schedule that defines a class of processes that can be used to build this upside down class of structural embodiments. Step 82, like step 14 in FIG. 2, symbolizes the process of selecting the material and physical dimensions of plastic substrate 10 based upon the expected operating environment and other operating characteristics the RFID tag will need to have when it operates such as strength, flexibility, opacity, young's modulus etc.

Step 84 represents the process of depositing nitride or oxide layers 12A and 12B at a thickness needed to achieve the substantial strain match at operating temperature, as previously described. The process of depositing this layer is as previously described with respect to step 16 in FIG. 2. The reader should assume that all the steps in the process of FIG. 4 can be performed by the same processes and alternatives previously described with reference to the process of FIG. 2 unless otherwise advised.

Step 86 represents the process of forming the antenna 88 on top of the nitride or oxide layer 12B. This can be done by any of the conventional antenna forming processes. As was the case for the structure of FIG. 1, the antenna may be formed on more than one layer with through hole vias for low frequency tags that require many turns.

Step 90 represents the process of depositing a layer of metal on top of the nitride layer 12B to form the antenna lead lines 92 and 94 in FIG. 3. These leads are photolithographically etched, as represented by step 100, to run from the antenna contact pads to areas above which vias will be formed to make contact to source and drain regions S and D of the transistor formed above the lead lines.

Step 102 represents the process of depositing the layer of oxide which will become the insulation layer shown at 104 in FIG. 3 through which the via holes to the source and drain regions are etched.

Step 106 represents the photolithographic process to define the via holes shown as filled with metal at 108 and 110. Step 112 represents the process of sputtering or otherwise depositing a layer of contact metal, typically aluminum, to fill the via holes at 108 and 110. Typically this layer is from 500 to 2000 angstroms thick but it only needs to be enough to achieve good step coverage and the via holes do not need to be small. Step 114 represents the process of photolithographically etching the metal just deposited to remove all the metal from the horizontal surfaces on top of the oxide layer 104 to leave just metal filling the via holes.

Next, a layer of silicon is deposited by sputtering, PECVD etc., as described above, to form the silicon layer from which source, drain and channel regions, S, D and C, respectively, are formed, as symbolized by step 116.

If higher performance devices are desired, step 118 is performed to crystallize the amorphous silicon of layer 120 to polysilicon by the pulsed excimer laser process described above.

Step 122 represents the process of depositing a layer of silicon dioxide to form the gate oxide of gate 124. This is typically done by the same process as described above to form gate oxide 26 in FIG. 1.

Next, a layer of metal (or any of the other gate material alternatives defined above) is deposited to form the gate electrode 126, as symbolized by step 178. Step 130 represents the photolithographic etching processes to etch away the metal layer just deposited and the underlying gate oxide to define the lateral extents of the TFT island comprised of gate 126 and gate oxide 124. This leaves a layer of amorphous or poly silicon exposed, depending upon whether step 118 was or was not performed.

Step 132 represents the process of doping and crystallizing the source and drain regions S and D with impurities by the GILD process and pulsed excimer laser crystallization processes described above. This leaves doped poly source and drain regions and an undoped amorphous or poly silicon channel region C under the gate oxide.

Step 134 represents the process of photolithographically etching through the various layers to define the lateral extent of the source and drain regions to prevent unintended connections between these source and drain regions and source and drain regions of other transistors being simultaneously formed elsewhere on the integrated circuit. It is the job of the metalization layer represented by leader lines 92 and 94 to connect the source and drain terminals of the transistor to wherever else in the circuit they are to be connected. Each transistor in the RFID tag IC has such leader lines which lead from its source and drain vias to other terminals of other transistors or passive components in the RFID tag transceiver to implement the necessary connections needed to make the circuit function. Step 136 represents the process of depositing a layer of oxide 138 over the top of the structure to insulate the gate, source and drain regions from any other unintended electrical contact. Not shown as a series of separate steps are the photolithography and etching steps necessary to form a via 140 through oxide 138 for a gate contact and the deposition step to lay down a layer of metal and the photolithography and etching steps to form gate contact metallization 142 to fill the via and connect the gate to whatever else in the circuit to which it needs to be connected.

Step 144 represents the encapsulation process to protect the final IC structure.

A paper which is commercially available on the internet at URL http://itri.loyola.edu/dsply_jp/c3_s1.htm entitled Chapter 3: *Manufacturing and Infrastructure of Active Matrix Liquid Crystal Displays*, by Malcolm Thomson is hereby incorporated by reference. This paper teaches at FIG. 3.1 the process used to make TFT transistors for flat panel displays. Inspection of this process reveals that it is quite similar to the process described herein needed to make the ICs on plastic substrates and to the IBM and Lawrence Livermore thin film transistor processes described above. Thus, the flat panel display manufacturing equipment already commercially available and in use in Japan can be used to integrate ICs onto the plastic substrates of RFID tags or smart cards so long as they are configured to use process recipe files that define one of the process sequences described herein that is compatible with the selected plastic substrate. These flat panel display manufacturing machines operate under the control of data in process configuration or recipe files that define the process temperatures, gas types and composition, RF energy levels etc. that together are the selected one of the process recipes defined herein. These process recipe files will contain data defining a process which is compatible with the substrate selected for the RFID tag or smart card so as not to melt, warp, deform, chemically attack or otherwise damage the substrate. It is easiest to tell the flat panel manufacturing machine manufacturer at the outset which gases are to be used. That way the machine is configured at the factory with the proper gas flow controller. This is necessary since each gas has its own density, and requires a unique flow controller to make sure the right amount of gas is added to the process under control of the process recipe file. However, existing flat panel manufacturing machines can be retrofitted for new gases by changing the flow controller and removing all the old plumbing from the gas supply through the flow controllers to the deposition chambers so that residues of gases previously used in the machine are not inadvertantly added to the process.

One modification that is necessary is to provide additional support to the plastic substrate in the cartridges that are loaded into the PECVD reaction chamber. These cartridges typically stand vertically as a square column with one side or facet removed so as to provide robot access. The three remaining sides each have fingers or projections that stick out from the sides like the slots in a CD storage tower. Because the plastic substrates used for RFID tags are much thinner than plastic and glass substrates used for flat panel displays, there is more sag in the middle of large, thin plastic substrates to be processed than there is in the thicker plastic and glass substrates. More sag is a problem, because if one substrate sags in the middle so low as to contact the substrate below it, there will be defects caused in the substrate below where the gases were denied access to the upper surface being processed. To remedy this problem, additional support fingers can be added on each of the three sides on which support is provided including supports midspan or close to the middle of each span.

Flat panel display manufacturing machines that can be used to carry out the processes of the invention are disclosed in the 1994 and 1995 Digests of Technical Papers from the Display Manufacturing Technology Conference, First Edition, January 1995 published by the Society for Information Display, 1526 Brookhollow Drive, Suite 82, Santa Ana, Calif. 92705-5421, which are both incorporated by reference herein. These digests includes papers by Law et al. and Schmitt et al. which describe PECVD systems for large area substrates capable of depositing nitride films and amorphous silicon. Another paper by Chen et al. describes a high throughput excimer laser annealing system for low temperature polysilicon TFT for large substrate flat panel display manufacture. Another paper by Ocker et al. teaches a high productivity sputtering system for use in flat panel dispay manufacturing. Another paper by Aoki et al. teaches a dry etch technology for use in manufacturing large size flat panel displays. Another paper by Ruth et al. teaches large area sputtering systems for coating flat panel display integrated circuits with silicon dioxide. Another paper by Watabe teaches improvements in in-line plasma CVD systems. Another paper by Gentry et al. teaches sputtering systems for deposition of ITO and metals on large glass substrates of flat panel displays. Other papers describe etching with Helicon technology, PECVD processes etc. A paper by Sheets et al. teaches scanning projection exposure tools for performing photolithography on large area thin film substrates for flat panel displays.

These machines can be controlled to implement the processes described herein by setting the machine controls to establish the right temperature, pressure and voltage level conditions and supplying the gases identified above to carry out the process steps defined above. For example, the flat panel display PECVD machines have their controls manipulated to limit the maximum temperatures to less than the glass transition temperature of the particular plastic substrate chosen. In addition, the proper gases (such as helium, nitrogen and ammonia and silane) are supplied in the correct proportions as identified above at the proper flow rates, e.g., 875 sccm (or the machine is controlled to mix the gases as needed and regulate the flow rate) and the chamber pressure control is set to establish the proper pressure, for example 0.6 Torr. The machine controls are then set to establish the proper power per unit area to establish the plasma, for example 0.05 Watts/cm$^2$.

Similar control manipulations and selection of supply gases and chemicals are made for the etching processes to implement the processes described above for plasma dry etching or wet chemical etching. Photolithography is done conventionally as is done in the flat panel manufacturing prior art.

Similarly, flat panel display manufacturing ELA machine has its controls manipulated to establish the laser fluence levels and pulse times defined in the crystallization and laser anneal process steps described earlier.

For an RFID tag or smart card to be useful, it must store memory. Thin film transitor static ram cells may be used if there is a battery on the tag. But for completely passive tags with no batteries, memory cells can be formed as nonvolatile EEPROM or ROM cells.

Figure 7:
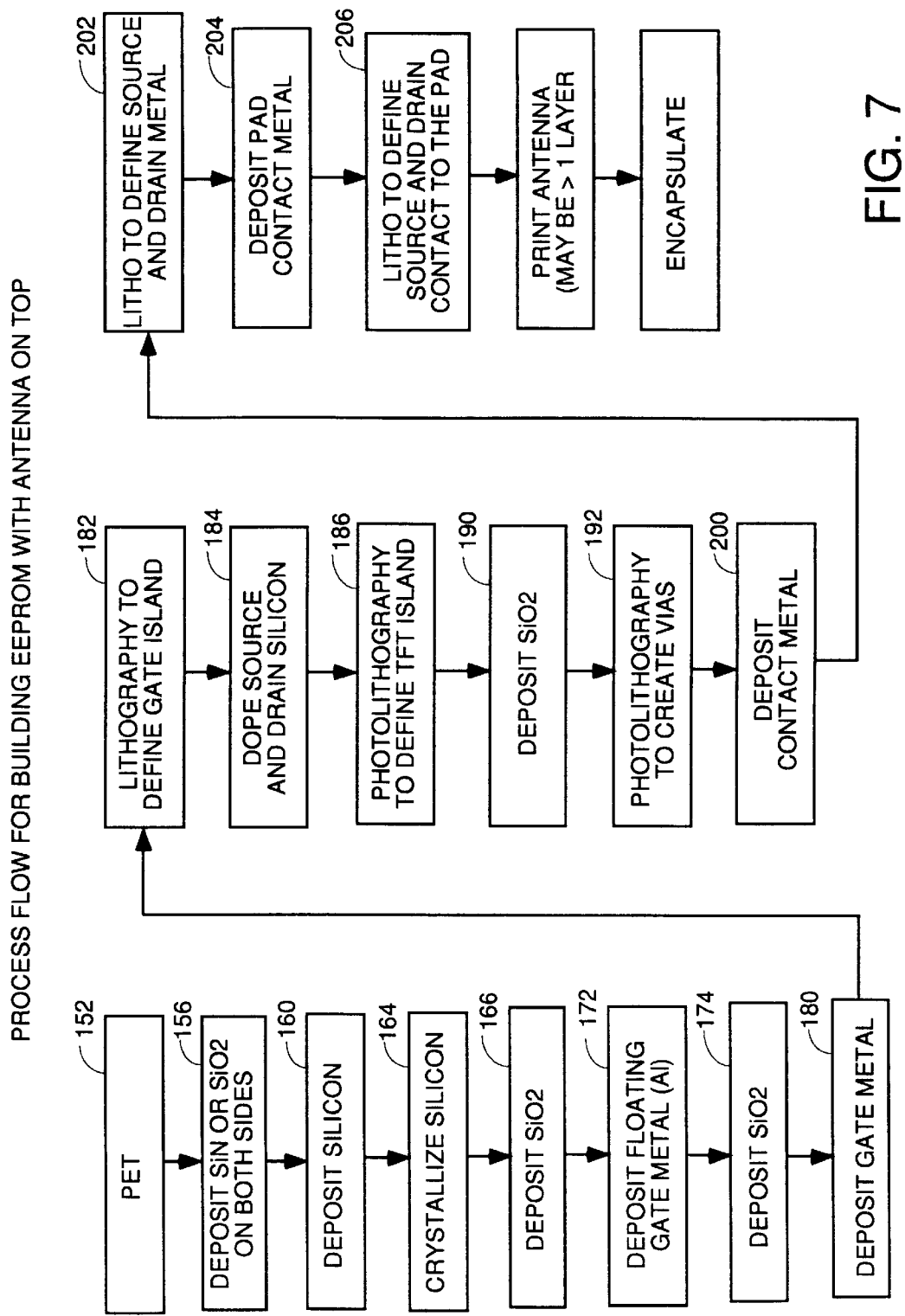
FIG. 7 is a process flow for building a TFT EEPROM memory cell on a plastic substrate with an antenna on top.

FIG. 7 is a process flow for a process to manufacture the EEPROM structure shown in FIG. 8. The steps of FIG. 7 that are identical to process steps of FIG. 2 or FIG. 4 are performed with any of the process steps defined above to accomplish the desired result or equivalents. The other steps which are not present in either FIG. 2 or FIG. 4 are performed with the same processes described above for deposits and etching of metal and oxide layers. Considering FIGS. 7 and 8 togethr, step 156 represents selection of the substrate material for substrate 154. Step 156 represents the deposition of the nitride or oxide layers 158A and 158B to the proper thicknesses to eliminate or reduce differential strain at the anticipated operating temperature and/or, in some embodiments, to protect the substrate from the strong acids and bases and etchants of subsequent processing steps. Step 162 represents the process of depositing amorphous silicon layer 162. Step 164 represents the optional excimer laser pulse heating of the amorphous silicon layer to crystallize it into polysilicon or microcrystalline silicon. Step 166 is a PECVD deposition of gate oxide layer 168 below floating gate 170. In some embodiments, nitride could also possibly be used. In processes to build integrated circuits that include plain MOS transistors in addition to EEPROM cells, step 166 will typically be accomplished by masking off areas where MOS transistors are being formed to expose areas where EEPROM memory cells are to be formed. Then one or more layers of gate insulator are deposited by PECVD to form an insulation layer that is to lie below the floating gate, where the thickness and materials selected for said one or more layers of gate insulator are such as to achieve Fowler-Noordheim tunnelling to the floating gate from a channel region at whatever programming voltage can be achieved on said integrated circuit. Programming voltages at about 5 volts or below have been recently achieved in EEPROMs and may continue to descent. Programming voltages on active tags can be higher by virtue of the presence of a battery than can be achieved on passive tags. The PECVD deposition is accomplished at a temperature below the glass transistion temperature of said plastic substrate.

Step 172 represents the process of depositing a layer of metal which will later be photolithographically etched to form floating gate 170. Step 176 is a PECVD deposition of an oxide layer 176 above the floating gate and below the control/programming gate 178 although other processes to deposit this oxide such as sputtering might also be used so long as the insulator formed thereby has sufficient electrical integrity to maintain the charge on floating gate 170. Likewise, the step 166, can be a that does not melt the substrate and deposits an insulator underneath the floating gate which is sufficiently thin to allow tunnelling between the floating gate and channel region C and which has sufficient electrical integrity to prevent leakage of charge off the floating gate. The thickness of layer 168 is typically the same thickness as conventional EEPROMs for read only or write-once-read-many tags which is the case for most RFID tag applications as well as toy controllers. Further, the thickness of layer 168 can be a conventional EEPROM thickness for active tags with on-board batteries where adequate programming voltages can be achieved in the field to program the tag or smart card memory with new or changed data. The insulation layer 168 may also have a composite structure as is known in some of the newer EEPROM designs so as to lower the programming voltage so as to achieve easier read-write operation in the field for passive tags. Such composite insulation layers below the floating-gate are known from U.S. Pat. No. 5,278,440 which is hereby incorporated by reference. Step 180 represents the process of depositing the metal layer that will become control/programming gate 178.

The metal of control and floating gates 178 and 170 can be deposited by any suitable deposition technique such as PVD, PECVD, evaporation or sputtering. Other metals or alloys such as Cu, Ni, Ti, Mo, Cr, Ta, W, Ti—Si, Ti—Al; Al—Si and Al—Cu can also be used. Also, doped silicon and silicides (silicon alloyed with a refractory metal) may also be used for the gate 178 as well as the gate 170.

Step 182 represents a process of photolithographically defining the lateral extents of the control gate 178, the intergate insulator 176, the floating gate 170 and the insulating layer 168 below the floating gate. As such, this step may involve more than one wet and/or dry etching processes to etch each layer in turn, and the two metal layers may be different etching steps involving different etchants since they may be different materials in some embodiments.

Step 184 represents the GILD or other doping process to dope and excimer laser anneal the source and drain regions S and D in semiconductor layer 162. Step 186 represents the process of photolithographically etching to define the lateral extents of the TFT island to define a single device and isolate it from neighboring devices.

Step 190 represents the process of depositing oxide layer 192 over the TFT island to insulate it and to serve as an insulation layer upon which the contact metallization can be formed. Step 192 represents the process of photolithographically etching vias 194, 196 and 198 through which source, drain and control/programming gate contacts may be made. Step 198 represents the process of depositing the contact metallization layer which fills vias 194, 196 and 198. Step 202 represents photolithographically etching the contact metallization pattern to make contact between the source, drain and gate regions of each TFT to other devices in the circuit to implement the RFID tag transceiver, smart card circuit, toy controller etc. Steps 204 and 206 represent the processes of depositing a metal layer to form leader line conductors 204 and 206 from the source and drain contacts to the contact pads 208 and 210 for the antenna 212 (which is formed on the plastic substrate by conventional means to make contact with the pads 208 and 210).

Those skilled in the art will appreciate that steps 204 and 206 can be combined with step 202 in some embodiments. They also understand that it is unlikely that an EEPROM cell will be connected directly to an antenna, so the structure of FIG. 8 and the process of FIG. 7 are only to illustrate how to build a thin film transistor EEPROM on a plastic substrate and not to illustrate the complete circuit structure of the RFID tag or or smart card transponder or toy controller since the circuitry will differ from one application to another.

The process of FIG. 7 was to build a TFT EEPROM on a plastic substrate with an antenna on top of the EEPROM. The process of FIG. 9 and the resulting structure of FIG. 10 are the upside down TFT EEPROM version that results from the process of FIG. 9. The process is self explanatory as is the structure and is implemented using the same process steps described elsewhere herein, as well as the alternatives discussed herein and equivalents.

The third and fourth classes of embodiments described in the summary of the invention can be manufactured by the following process or equivalents:

selecting a first plastic substrate having a large size which is compatible with the substrate size capacity of flat panel display manufacturing machines to be used to do the subsequent deposition, photolithography, etching steps needed to form an antenna or compatible with the substrate size capacity that can be processed by a silk screen printer to print an antenna;

depositing a layer of insulating material which has a thickness and Young's Modulus which are selected in light of the thickness and Young's Modulus of said plastic substrate so as to reduce differential strain at anticipated operating temperatures so as to eliminate or reduce reliability problems using a process which will not melt, warp, deform, chemically attack or otherwise damage said first plastic substrate;

using a flat panel display manufacturing machine or silk screen printer to form a plurality of antennas at a plurality of locations on said first plastic substrate with one or more terminals on said layer of insulating material using deposition, photolithography, etching or printing processes which will not melt, warp, deform, chemically attack or otherwise damage said first plastic substrate;

dicing said first plastic substrate up into many individual plastic substrates, each with its own antenna formed thereon;

selecting a second plastic or glass substrate having a large size which is compatible with the substrate size capacity of flat panel display manufacturing machines to be used to do subsequent deposition, photolithography, etching and laser crystallization and annealing steps necessary to form a thin film integrated circuit;

using flat panel display manufacturing machines to do the insulation, metal and semiconductor deposition steps, and the photolighography, etching and pulsed laser crystallization and annealing steps necessary to form an integrated circuit of a desired functionality on said plastic or glass substrate so as to RF input/output terminals, all said processing steps performed at temperatures or in a manner which will not exceed the glass transition temperature of said second glass or plastic substrate and using chemicals which will not chemically attack or otherwise damage said second plastic substrate;

dicing said second plastic or glass substrate up into many integrated circuits and bonding or otherwise attaching each functional integrated circuit to one of said individual plastic substrates cut from said first plastic substrate; and wire bonding wires to connect said RF input/output terminals of said integrated circuit to said one or more terminals of said antenna on said individual plastic substrate.

Embodiments where integrated circuits with both MOS transistors and EEPROM cells integrated directly on a plastic substrate can be made with the following process:

selecting a plastic substrate having a large size which is compatible with the substrate size capacity of flat panel display manufacturing machines to be used to do the subsequent deposition, photolithography, etching and laser crystallization and annealing steps necessary to form said integrated circuit thereon;

using flat panel display manufacturing machines to perform the following steps:

depositing a layer of insulating material which has a thickness and Young's Modulus which are selected in light of the thickness and Young's Modulus of said plastic substrate so as to reduce differential strain at anticipated operating temperatures so as to eliminate or reduce reliability problems using processing steps performed at temperatures or in a manner which will not exceed the glass transition temperature of said plastic substrate and using chemicals which will not chemically attack or otherwise damage said plastic substrate;

depositing a layer of amorphous silicon which is between 10 and 500 nanometers thick by sputtering or by plasma enhanced chemical vapor deposition hereafter referred to as PECVD using processing steps performed at temperatures or in a manner which will not exceed the glass transition temperature of said plastic substrate and using chemicals and/or gases which will not chemically attack or otherwise damage said plastic substrate;

if higher mobilities or higher ON currents or lower threshold voltages for MOS transistors are needed for the transistors to be formed in said silcon layer than can be achieved in amorphous silicon, crystallizing said silicon layer to polycrystalline or microcrystalline form by pulse annealing the silcon layer with an excimer laser having a 308 nm wavelength using pulse durations of 30 nanoseconds or less full width at half maximum and energy density between 30–600 mJ/cm$^2$ per pulse using one or more pulses;

masking off areas of said integrated circuit where EEPROM cells, if any, are to be formed, and depositing a layer of gate insulator by PECVD at a temperature below the glass transistion temperature of said plastic substrate, said layer having a thickness suitable for thin film metal-oxide-semiconductor transistor device operation, typically between 20–500 nanometers thick;

masking off areas where MOS transistors are being formed to expose areas where EEPROM memory cells are to be formed and depositing one or more layers of gate insulator to form an insulation layer that is to lie below the floating gate, the thickness and materials selected for said one or more layers of gate insulator being such as to achieve Fowler-Noordheim tunnelling to the floating gate from a channel region at whatever programming voltage can be achieved on said integrated circuit, said deposition being accomplished by PECVD at a temperature below the glass transition temperature of said plastic substrate;

depositing a layer of gate conductor, typically metal or silicides by physical vapor deposition (hereafter PVD), chemical vapor deposition (hereafter CVD), PECVD, evaporation or sputtering or some other suitable process to form a control gate at the MOS transistor locations and a floating gate at the EEPROM cell locations, said deposition being accomplished at a temperature below the glass transition temperature of said plastic substrate;

masking off locations where MOS transistors are being formed to leave exposed only locations where EEPROM cells are being formed, and depositing a layer of intergate insulator from which will be formed the insulation layer between the floating gate and the control gate of each EEPROM cell, said deposition being accomplished by PECVD or some other process which will form an insulator of high enough quality to prevent charge leakage from said floating gate and at a temperature below the glass transition temperature of said plastic substrate;

masking off locations where MOS transistors are being formed to leave exposed only locations where EEPROM cells are being formed, and depositing a layer of metal or silicide from which the control gate of all EEPROM cells is to be formed, said deposition being by PVD, CVD, PECVD, evaporation or sputtering or some other suitable process and accomplished at a temperature below the glass transition temperature of said plastic substrate;

performing the necessary photolithographic etching to define the gate islands at both said MOS transistor and EEPROM cell locations, said photolithographic etching being accomplished at temperatures below the glass transition temperature of said plastic substrate and using chemicals and/or gases which will not attach or otherwise damage said plastic substrate;

doping the source and drain regions of all said MOS transistors and EEPROM cells using the Gas Immersion Laser Doping process or any other suitable doping process which can dope said source and drain regions to suitable conductivity and which crystallizes said amorphous silicon by pulsed laser annealing and which can be accomplished at a temperature below the glass transition temperature of said plastic substrate and using chemicals and/or gases which will not attack or otherwise damage said plastic substrate;

photolithographically etching to define the lateral extents of each thin film transistor island at each MOS transistor and EEPROM cell, said photolithographic etching being accomplished at temperatures below the glass transition temperature of said plastic substrate and using chemicals and/or gases which will not attach or otherwise damage said plastic substrate;

depositing an insulation layer over all MOS transistors and EEPROM cells and etching vias therethrough for source, drain and control gate contacts at all MOS transistor and EEPROM cell locations, said deposition being accomplished at temperatures below the glass transition temperature of said plastic substrate and using chemicals and/or gases which will not attack or otherwise damage said plastic substrate;

depositing a layer of contact metallization conductor to fill said via holes and cover each MOS transistors and EEPROM cell location and the spaces therebetween, and photolithographically etching the conductor layer to form a contact metallization to connect all the MOS transistors and EEPROM cells together to form the desired integrated circuit functionality.

A process to form an integrated circuit containing MOS transistors and EEPROM cells over an antenna formed on a plastic substrate is as follows:

selecting a plastic substrate having a large size which is compatible with the substrate size capacity of flat panel display manufacturing machines to be used to do the subsequent deposition, photolithography, etching and laser crystallization and annealing steps necessary to form said integrated circuit thereon;

using flat panel display manufacturing machines to perform the following steps:

depositing a layer of insulating material which has a thickness and Young's Modulus which are selected in light of the thickness and Young's Modulus of said plastic substrate so as to reduce differential strain at anticipated operating temperatures so as to eliminate or reduce reliability problems using processing steps performed at temperatures or in a manner which will not exceed the glass transition temperature of said plastic substrate and using chemicals which will not chemically attack or otherwise damage said plastic substrate;

forming an antenna with one or more terminals on said layer of insulating material deposited in the previous step at a plurality of locations on said substrate by any prior art process such as silk screening or deposition and photolithographic etching accomplished at temperatures below the glass transition temperature of said substrate and using chemicals and/or gases that will not attack or otherwise damage said plastic substrate;

using flat panel display manufacturing machines to perform the following steps:

depositing a layer of pad contact conductor such as metal or silicides by physical vapor deposition (hereafter PVD), chemical vapor deposition (hereafter CVD), PECVD, evaporation or sputtering or some other suitable process and photolithographically etching to form lead line conductors from each antenna terminal to the locations where RF input/output terminals of each corresponding integrated circuit will be formed, said deposition being accomplished at a temperature below the glass transition temperature of said plastic substrate;

depositing a layer of insulator over all MOS transistor and EEPROM cell locations and etching to form vias through said insulation layer where source and drain contacts are to be formed, said deposition being accomplished by PECVD or some other process which will form an insulator of high enough quality and at a temperature below the glass transition temperature of said plastic substrate using chemicals and/or gases which will not attack or otherwise damage said plastic substrate;

depositing a layer of contact metallization conductor such as metal or silicides by physical vapor deposition (hereafter PVD), chemical vapor deposition (hereafter CVD), PECVD, evaporation or sputtering or some other suitable process and photolithographically etching to form lead line conductors to make all necessary source and drain connections from each MOS transistor or EEPROM cell to other devices needed to establish at least part of the connections needed for the functionality of the integrated circuit being formed, said deposition being accomplished at a temperature below the glass transition temperature of said plastic substrate;

depositing a layer of amorphous silicon which is between 10 and 5000 nanometers thick by sputtering or by plasma enhanced chemical vapor deposition hereafter referred to as PECVD using processing steps performed at temperatures or in a manner which will not exceed the glass transition temperature of said plastic substrate and using chemicals and/or gases which will not chemically attack or otherwise damage said plastic substrate;

if higher mobilities or higher ON currents or lower threshold voltages for MOS transistors are needed for the transistors to be formed in said silcon layer than can be achieved in amorphous silicon, crystallizing said silicon layer to polycrystalline or microcrystalline form by pulse annealing the silcon layer with an excimer laser having a 308 nm wavelength using pulse durations of 30 nanoseconds or less full width at half maximum and energy density between 30–600 mJ/cm$^2$ per pulse using one or more pulses;

masking off areas of said integrated circuit where EEPROM cells, if any, are to be formed, and depositing a layer of gate insulator by PECVD at a temperature below the glass transition temperature of said plastic substrate, said layer having a thickness suitable for thin film metal-oxide-semiconductor transistor device operation, typically between 20–500 nanometers thick;

masking off areas where MOS transistors are being formed to expose areas where EEPROM memory cells are to be formed and depositing one or more layers of gate insulator to form an insulation layer that is to lie below the floating gate, the thickness and materials selected for said one or more layers of gate insulator being such as to achieve Fowler-Noordheim tunnelling to the floating gate from a channel region at whatever programming voltage can be achieved on said integrated circuit, said deposition being accomplished by PECVD at a temperature below the glass transition temperature of said plastic substrate;

depositing a layer of gate conductor, typically metal or silicides by physical vapor deposition (hereafter PVD), chemical vapor deposition (hereafter CVD), PECVD, evaporation or sputtering or some other suitable process to form a control gate at the MOS transistor locations and a floating gate at the EEPROM cell locations, said deposition being accomplished at a temperature below the glass transition temperature of said plastic substrate;

masking off locations where MOS transistors are being formed to leave exposed only locations where EEPROM cells are being formed, and depositing a layer of intergate insulator from which will be formed the insulation layer between the floating gate and the control gate of each EEPROM cell, said deposition being accomplished by PECVD or some other process which will form an insulator of high enough quality to prevent charge leakage from said floating gate and at a temperature below the glass transition temperature of said plastic substrate;

masking off locations where MOS transistors are being formed to leave exposed only locations where EEPROM cells are being formed, and depositing a layer of metal or silicide from which the control gate of all EEPROM cells is to be formed, said deposition being by PVD, CVD, PECVD, evaporation or sputtering or some other suitable process and accomplished at a temperature below the glass transition temperature of said plastic substrate;

performing the necessary photolithographic etching to define the gate islands at both said MOS transistor and EEPROM cell locations, said photolithographic etching being accomplished at temperatures below the glass transition temperature of said plastic substrate and using chemicals and/or gases which will not attach or otherwise damage said plastic substrate;

doping the source and drain regions of all said MOS transistors and EEPROM cells using the Gas Immersion Laser Doping process or any other suitable doping process which can dope said source and drain regions to suitable conductivity and which crystallizes said amorphous silicon by pulsed laser annealing and which can be accomplished at a temperature below the glass transition temperature of said plastic substrate and using chemicals and/or gases which will not attack or otherwise damage said plastic substrate;

photolithographically etching to define the lateral extents of each thin film transistor island at each MOS transistor and EEPROM cell, said photolithographic etching being accomplished at temperatures below the glass transition temperature of said plastic substrate and using chemicals and/or gases which will not attach or otherwise damage said plastic substrate;

depositing an insulation layer over all MOS transistors and EEPROM cells and etching vias therethrough for control gate contacts at all MOS transistor and EEPROM cell locations, said deposition being accomplished at temperatures below the glass transition temperature of said plastic substrate and using chemicals and/or gases which will not attack or otherwise damage said plastic substrate;

depositing a layer of contact metallization conductor to fill said via holes and cover each MOS transistors and EEPROM cell location and the spaces therebetween, and photolithographically etching the conductor layer to form a contact metallization to connect all the control gates of all MOS transistors and EEPROM cells to other nodes in the circuit to form the rest of the connections necessary to form a desired integrated circuit functionality.

Figure 9:
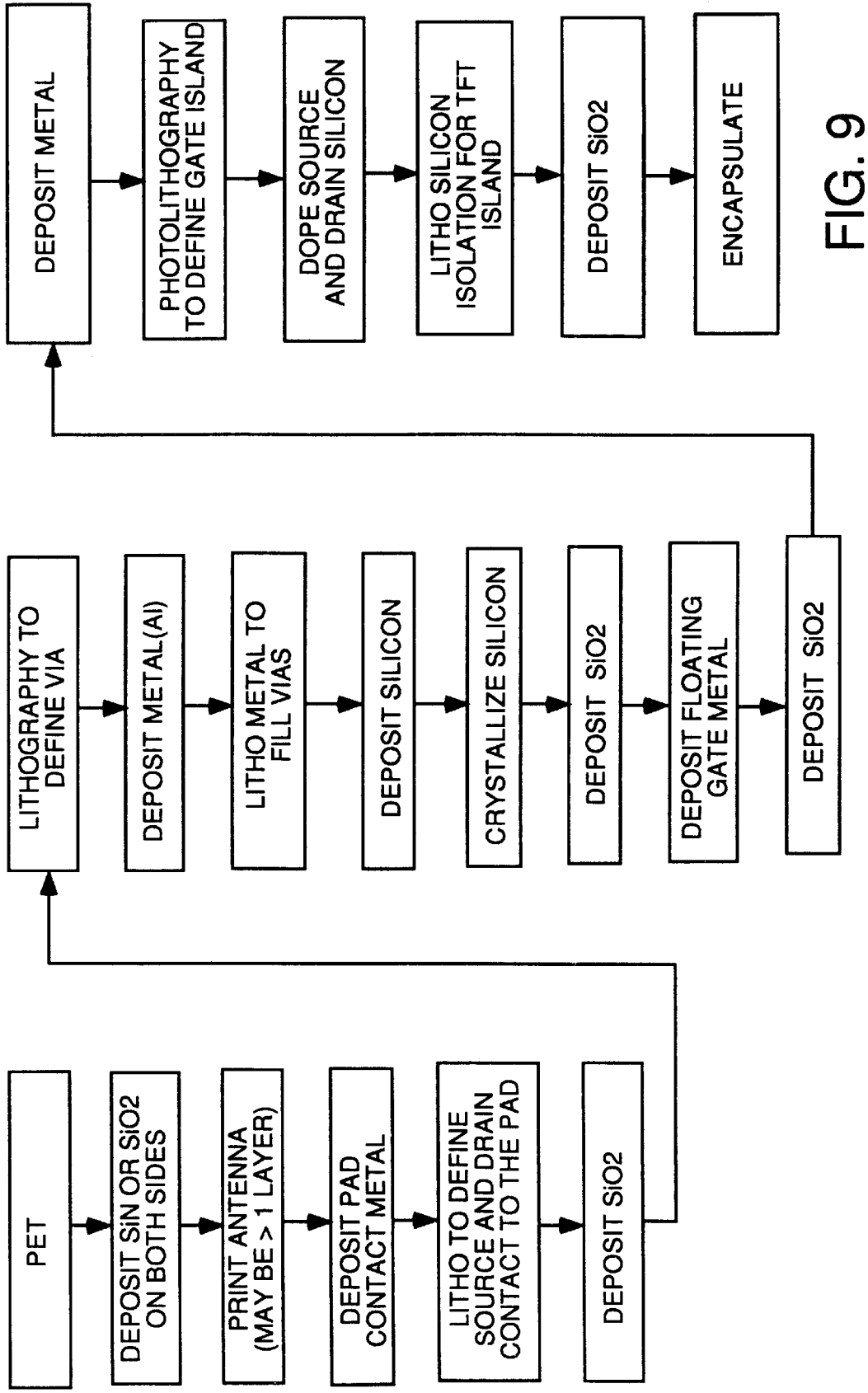
FIG. 9 is a process flow for building a TFT EEPROM cell on a plastic substrate with an antenna below the EEPROM cell.

The processes within the teachings of the invention for forming integrated circuits from thin film transistors formed on plastic substrates are also useful to make arrays of flash EEPROM cells on plastic substrates. The process would be the same as depicted in FIGS. 7 and 9 except the steps to form the antenna and leader lines to the antenna would be omitted. Some smart cards, RFID tags, toy controllers and other ICs on plastic substrates will only require read only memory for storing data which is never changed such as a program, a serial number etc. The processes used herein can be used to fabricate the ROM structures defined in U.S. Pat. Nos. 3,914,855 and 4,384,345, both of which are hereby incorporated by reference. The ROM structure defined in U.S. Pat. No. 3,914,855 is an IGFET structure where a matrix array of IGFETs is initially made all to be operable.

The invention has been described in terms of the preferred and some alternative embodiments disclosed herein. Those skilled in the art will appreciate that other alternative embodiments for various steps or device structures that achieve the same function and play the same role in the combination exist.

A good background discussion on the fundamentals of how RFID tags work and how the prior art tags are fabricated (including antenna construction, die bonding, wire bonding and final encapsulation) is given by Michael Davis, Director of Engineering at Allsafe Company on the internet at www.rwprox.com, which is hereby incorporated by reference. Good background discussions of many of the various deposition and etching techniques for fabrication of semiconductors are given in Gise et al., *Semiconductor & Integrated Circuit Fabrication Techniques* (Reston Publishing Company, 1979), ISBN 0-87909-668-3, and Elliott, *Integrated Circuit Fabrication Technology*, (McGraw Hill 1982), ISBN 0-07-019238-3, and Hamilton et al., *Basic Integrated Circuit Engineering*, (McGraw Hill 1975), ISBN 0-07-025763-9, all of which are hereby incorporated by reference. Other references on integrated circuit fabrication that are incorporated by reference herein are: Shepard, *Integrated Circuit Design, Fabrication and Test*, ISBN: 007057278X; Veronis, *Integrated Circuit Fabrication Technology*, ISBN: 0835930920; Glaser, *Integrated Circuit Engineering: Design, Fabrication, and Applications*, ASIN: 0201074273; Elliott, *Integrated Circuit Fabrication Technology*, ASIN: 0070193398; Collective Author, *Integrated Circuit Fabrication Technology, ASIN:* 0070192383; Smith, *Thin Film Deposition: Principles and Practice*, (McGraw Hill) ISBN: 0070585024; Vossen, *Thin Film Processes II*, (Academic Press) ISBN: 0127282513; Eishabini-Riad, *Thin Film Technology Handbook (Electronic Packaging and Interconnection Series)*, (McGraw Hill) ISBN: 0070190259; Friedman, *Advanced Flat Panel Display Technologies (Spie Proceedings Vol.* 2174) (1994), Society of Photo-optical Instrumentation Engineers, ISBN: 0819414697; Fedrow, *Flat Panel Display Handbook*, Stanford Resources, Inc. ISBN: 0967124301; Fulks et al., *Flat Panel Display Materials III: Symposium Held* Mar. 31–Apr. 3, 1997, San Francisco, Calif., U.S.A., (*Materials Research Society Symposia, V.* 47, Material Research Society, ISBN: 1558993754. Any of the etching, photolithography, deposition or doping processes, materials, machines or other know how described in these references (or otherwise known in the prior art) that can be used to manufacture thin film integrated circuits or particular layers thereof which do not melt, warp, attack or otherwise damage whatever plastic is chosen for the substrate and the antenna structure (if the antenna is formed before the integrated circuit) are deemed to be equivalent so long as the substituted process, step, material, or processing conditions creates layers of semiconductor, metal or insulation which are adequate for switching, amplification or nonvolatile or volatile data storage at the proposed operating temperature in the proposed application and subject to the other environmental factors of the intended use of the RFID tag, smart card or toy controller. All such alternatives are intended to be included within the scope of the appended claims.

What is claimed is:

1. A process for making an RFID tag on a plastic or glass or plastic laminated to glass substrate, comprising the steps of:

1) forming an antenna for an RFID tag on a plastic or glass or plastic laminated to glass substrate;

2) using a flat panel display manufacturing machine or any machine capable of performing the same functions as a flat panel display manufacturing machine on a plastic, glass or plastic laminated to glass substrate to perform processing to form an integrated circuit RFID tag transceiver with an antenna port on a plastic or glass or plastic laminated to glass substrate; and 3) electrically connecting said antenna port of said RFID tag transceiver to said antenna;

wherein said step 2) comprises:

forming a first layer of insulating material on both surfaces of said substrate, said first layer of insulating material having a thickness and Young's modulus which is selected in light of the thickness and Young's modulus of said substrate so as to reduce differential strain to a level which will not cause failure of said substrate or any structure formed on said substrate at anticipated temperatures to be encountered in the future;

forming a layer of amorphous semiconductor on said first layer of insulating material;

forming gate insulator layer;

forming layer of gate conductor material over said gate insulator layer;

photolithographically etching to form the gate islands of one or more transistors to expose at least areas of said layer of amorphous semiconductor where source and drain doping is to occur;

crystallizing and doping the amorphous silicon semiconductor to form source and drain regions for each transistor thereby leaving an undoped semiconductor region below each island;

etching to form thin film transistor islands to isolate each transistor from the others;

forming an insulating layer over all the transistors formed on said substrate and etching via holes therein to allow contacts to source and drain regions and the gate of each transistor;

forming a layer of conductive material to fill all via holes and make electrical contact with said source, drain and gate structures of each transistor;

etching said layer of conductive material to form the pattern of electrical connections between source, drain and gate structures of said transistors to form said RFID tag transceiver circuit and to form antenna contact leader lines;

forming a layer of insulation over said pattern of electrical connections and forming via holes where contacts to said antenna contact leader lines can be made; and forming a conductive antenna pattern over said layer of insulation over said pattern of electrical connections so as to make electrical contact with said antenna contact leader lines.

2. The process of claim 1 wherein said step of photolithographically etching said one or more gate islands is an anisotropic etch to allow greater density of transistor structures to be formed.

3. The process of claim 1 wherein said substrate said antenna is formed upon is the same substrate said RFID tag transceiver is formed upon.

4. The process of claim 1 wherein said substrate upon which said antenna is formed is the same substrate upon which said RFID tag transceiver is formed and further comprising a step of forming an insulation layer with via holes therein between said RFID tag transceiver integrated circuit and said antenna, said via holes placed such that connection between said antenna and said antenna port of said transceiver integrated circuit is possible, and wherein the step of connecting said antenna port of said RFID tag transceiver to said antenna comprises forming a conductive material connected to said antenna and passing through said via holes so as to connect to said antennat port.

5. The process of claim 1 wherein said substrate upon which said antenna is formed is a different substrate than the substrate upon which said RFID tag transceiver is formed, and further comprising the step of bonding one substrate to the other and wherein said step of connecting said antenna port to said antenna comprises the step of wiring bonding wires from said antenna port to said antenna.

6. The process of claim 1 wherein said antenna is formed first on said inexpensive substrate and wherein said processing to form said antenna includes steps to form an interdevice insulation layer over said antenna with via holes formed therein such that electrical contact may be made to said antenna and wherein said step of forming an integrated circuit RFID tag transceiver comprises integrating said transceiver on a layer of amorphous semiconductor deposited over said interdevice insulation layer and integrating said transceiver into said semiconductor layer such that said antenna port is connected via conductive material passing through said via holes.

7. The process of claim 6 wherein said processing to form said antenna comprises forming said antenna photolithographically.

8. The process of claim 6 wherein said processing to form said antenna comprises forming said antenna by silk screening said antenna on a layer of insulation formed over said inexpensive substrate.

9. The process of claim 6 wherein said processing to form said antenna comprises forming said antenna by sputter deposition or electroplating of a layer of insulation formed over said inexpensive substrate and then photolithographically etching said antenna pattern to make a series of planar loops.

10. The process of claim 1 wherein said integrated circuit RFID tag transceiver is formed first on said inexpensive substrate and wherein said processing to form said integrated circuit RFID tag transceiver includes steps to form an interdevice insulation layer over said integrated circuit RFID tag transceiver with via holes formed therein such that electrical contact may be made to said antenna port of said integrated circuit RFID tag transceiver and wherein said step of forming an antenna comprises integrating said antenna on said interdevice insulation layer and forming said antenna on said interdevice insulation layer.

11. The process of claim 1 further comprising the step of cyrstallizing said layer of amorphous semiconductor after it is deposited and before any transistor soure and drain regions are formed therein.

12. The process of claim 1 wherein said processing carried out by said flat panel display manufacturing machine or other machine capable of performing processing carried out by flat panel display manufacturing machines is performed using thin film transistor processes, said processing comprising the steps of:

forming a first insulating layer on top and bottom surfaces of said substrate on which said transceiver is formed in step 2), said first insulating layer having a thickness and being of a material or combination of materials which is selected to have a Young's modulus so as to, in light of the thickness and Young's modulus of said substrate, substantially reduce any difference between strain of said first insulating layer and said substrate on which said transceiver is formed;

forming an antenna conductor over said first insulating layer with contact pads to which electrical contact to said antenna may be made;

forming a second layer of insulating material over said antenna conductor and contact pads and photolithographically etching via holes therein to allow electrical contact to be made to said antenna contact pads;

forming a layer of conductive material over said second insulating layer and etching away all conductive material on horizontal surfaces of said second insulating layer to leave said via holes filled with electrically conductive material;

forming a layer of amorphous semiconductor over said second layer of insulating material;

forming a layer of gate oxide over said layer of amorphous semiconductor;

forming a layer of conductive gate material over said gate oxide;

photolithographically etching one or more gate islands in said gate oxide and said layer of conductive gate material;

doping and crystallizing source and drain regions in said amorphous semiconductor layer which are self aligned with each said gate island thereby leaving an undoped semiconductor region between each gate island;

photolithographically etching through at least said amorphous semiconductor layer to define the lateral extents of each source and drain region to define a thin film transistor island around each gate island;

forming a third insulating layer over the top of the structure formed so far to insulate each source, drain and gate of each thin film transistor formed;

forming via holes in said third insulating layer to expose at least a part of the gate of each said thin film transistor and the source and drain regions that are necessary to be connected to form said RFID tag transceiver; and forming a pattern of conductive material that fills said via holes and connects together said thin film transistors in such a way as to form said RFID tag transceiver.

13. The process of claim 12 wherein said step of photolithographically etching said one or more gate islands is an anisotropic etch to allow greater density of transistor structures to be formed.

14. The process of claim 12 wherein said processing to form said antenna comprises forming said antenna photolithographically.

15. The process of claim 12 wherein said processing to form said antenna comprises forming said antenna by silk screening said antenna on a layer of insulation formed over said inexpensive substrate.

16. The process of claim 12 wherein said processing to form said antenna comprises forming said antenna by sputter deposition or electroplating of a layer of insulation formed over said inexpensive substrate and then photolithographically etching said antenna pattern to make a series of planar loops.

17. The process of claim 2 further comprising the step of cyrstallizing said layer of amorphous semiconductor layer after it is deposited and before any transistor soure and drain regions are formed therein.

18. A process for manufacturing an RFID tag integrated circuit including MOS transistors and EEPROM nonvolatile cells on an plastic, glass or plastic laminated to glass substrate comprising:

inserting an plastic, glass or plastic laminated to glass substrate into a flat panel display manufacturing machine or other machine capable of performing processing carried out by flat panel display manufacturing machines;

using a flat panel display manufacturing machine or any machine capable of performing the same functions as a flat panel display manufacturing machine on a plastic, glass or plastic laminated to glass substrate to perform a process defined by a recipe file that defines processing steps, gases and etchants that comprise a recipe to form thin film MOS transistors and/or EEPROM nonvolatile memory cells, said process comprising the following steps:

depositing a first layer of insulating material on both top and bottom surfaces of said plastic, glass or plastic laminated to glass substrate, said first insulating layer having a thickness and being of a material or combination of materials having a Young's Modulus which are selected in light of the thickness and Young's Modulus of said plastic, glass or plastic laminated to glass substrate so as to substantially reduce difference in strain between said plastic, glass or plastic laminated to glass substrate and said first layer of insulating material;

depositing a layer of amorphous semiconductor over said first insulating layer;

masking off areas of said integrated circuit where EEPROM cells are to be formed, and depositing a layer of gate insulator;

masking off areas where MOS transistors of said RFID tag transceiver are being formed to expose areas where EEPROM memory cells are to be formed and depositing one or more layers of gate insulator to form an insulation layer that is to lie below the floating gate;

depositing a layer of gate conductor;

masking off locations where MOS transistors are being formed to leave exposed only locations where EEPROM memory cells are being formed, and depositing a layer of intergate insulator from which will be formed the insulation layer between the floating gate and the control gate of each EEPROM cell;

forming a conductive layer from which the control gate of all EEPROM memory cells is to be formed;

photolithographically etching gate islands at both said MOS transistor and EEPROM cell locations;

doping and crystallizing source and drain regions in said amorphous semiconductor layer so as to be self aligned with said gate islands of all said MOS transistors and EEPROM memory cells;

photolithographically etching to define the lateral extents of each thin film transistor island at each MOS transistor and EEPROM memory cell;

depositing an insulation layer over all MOS transistors and EEPROM memory cells and etching vias therethrough for source, drain, gate and control gate contacts at all MOS transistor and EEPROM cell locations;

depositing and photolithographically patterning a conductive contact pattern that fills said via holes and conects all the MOS transistors and EEPROM cells together to form an RFID tag transceiver with nonvolatile memory and contact pads for an antenna port for connecting to an antenna;

forming a conductive antenna on the same substrate as said transceiver and which is electrically connected to said contact pads of said antenna port of said transceiver.

* * * * *